(12) United States Patent
Suda et al.

(10) Patent No.: US 6,987,410 B2
(45) Date of Patent: Jan. 17, 2006

(54) CLOCK RECOVERY CIRCUIT AND COMMUNICATION DEVICE

(75) Inventors: Masakatsu Suda, Tokyo (JP); Satoshi Sudou, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/835,253

(22) Filed: Apr. 29, 2004

(65) Prior Publication Data

US 2005/0110544 A1 May 26, 2005

(30) Foreign Application Priority Data

Nov. 20, 2003 (JP) .............................. 2003-391456

(51) Int. Cl.
*H03K 5/01* (2006.01)
(52) U.S. Cl. ...................................... 327/165; 375/355
(58) Field of Classification Search ................ 327/165, 327/141, 144, 149, 152, 153, 158, 161; 375/355, 375/375, 376
See application file for complete search history.

(56) References Cited

U.S. PATENT DOCUMENTS

| | | | | |
|---|---|---|---|---|
| 5,430,773 A | * | 7/1995 | Marbot | 375/373 |
| 5,590,154 A | * | 12/1996 | Forni et al. | 375/229 |
| 6,757,327 B1 | * | 6/2004 | Fiedler | 375/232 |

FOREIGN PATENT DOCUMENTS

| | | |
|---|---|---|
| JP | 5-110550 A | 4/1993 |
| JP | 9-224020 A | 8/1997 |
| JP | 11-88310 A | 3/1999 |
| WO | WO 03/036796 A1 | 5/2003 |

OTHER PUBLICATIONS

Patent Abstracts of Japan publication No. 09-224020, publication dated Aug. 26, 1997 (1 page).
Patent Abstracts of Japan publication No. 11-088310, publication date Mar. 30, 1999 (1 page).
Patent Abstracts of Japan publication No. 05-110550, publication date Apr. 30, 1993 (1 page).

* cited by examiner

*Primary Examiner*—Tuan T. Lam
(74) *Attorney, Agent, or Firm*—Osha-Liang LLP

(57) ABSTRACT

A clock recovery circuit includes plural stages of first variable delay elements for sequentially delaying a data signal by a first delay amount, plural stages of second variable delay elements for sequentially delaying a clock signal by a second delay amount which is larger than the first delay amount, a plurality of timing comparators for sampling a plurality of the data signals delayed by the plural stages of first variable delay elements with the clock signal delayed by the second variable delay elements of the same stages, a plurality of EOR circuits for performing exclusive OR operation on a pair of sampling results by a pair of the sequential timing comparators, and a recovery variable delay circuit for delaying the clock signal based on the operation result of the plurality of EOR circuits.

9 Claims, 19 Drawing Sheets

CLOCK RECOVERY CIRCUIT AND COMMUNICATION DEVICE

This patent application claims priority from a Japanese patent application No. 2003-391456 filed on Nov. 20, 2003, the contents of which are incorporated herein by reference.

BACKGROUND OF THE INVENTION

1. Field of the Invention

The present invention relates to a clock recovery circuit and a communication device. More particularly, the present invention relates to a clock recovery circuit for adjusting the timing of a clock signal against a data signal and a communication device provided with the clock recovery circuit.

2. Description of the Related Art

A communication LSI employs a clock recovery circuit for adjusting the phase of a clock signal to retrieve a data signal. Such clock recovery circuit compares the phases of the data signal and the clock signal and adjusts the phase of the clock signal using a variable delay circuit. A conventional variable delay circuit is configured with a rough delay circuit whose resolution is low and variable amount is large, a fine delay circuit whose resolution is high and variable amount is the same as the rough delay circuit and a fine delay circuit for compensating the change of the propagation delay time due to the change of the noise or the environmental conditions in real time. As the fine delay circuit for compensating the change of the propagation delay time due to the change of the noise or the environmental conditions in real time, one used together with a voltage controlled oscillator (VCO) of a DLL circuit is proposed (cf. International Publication No. 03/036796).

However, in the fine delay circuit used together with the voltage controlled oscillator (VCO) of the DLL circuit, a variable amount as much as compensating the change of the processes, the noise, and the change of the environmental conditions is needed, so the circuit size increases and besides the degree of the eye opening of the data due to the phase noise of the PLL circuit becomes narrow.

SUMMARY OF THE INVENTION

Therefore, it is an object of the present invention to provide a clock recovery circuit and a communication device, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a clock recovery circuit for adjusting timing of a clock signal to a data signal includes plural stages of first variable delay elements coupled in series for sequentially delaying the data signal by a first delay amount, plural stages of second variable delay elements coupled in series for sequentially delaying the clock signal generated by a reference clock generating circuit as much as a second delay amount which is larger than the first delay amount, a plurality of timing comparators for sampling each of a plurality of the data signals delayed by each of the plural stages of first variable delay elements with the clock signal delayed by the second variable delay elements whose stages are respectively the same as the plural stages of first variable delay elements, a plurality of EOR circuits for performing exclusive OR operation respectively on sets of a plurality of the sampling results, a pair of sampling results by each of pairs of the sequential timing comparators being taken as one of the sets of a plurality of the sampling results, a timing judging unit for judging the timing of the clock signal generated by the reference clock generating circuit corresponding to the data signal based on an operation result of each of the plurality of EOR circuits, and a recovery variable delay circuit for delaying the clock signal generated by the reference clock generating circuit based on a judgment result of the timing judging unit.

The timing judging unit may judge the timing of the clock signal generated by the reference clock generating circuit corresponding to the data signal by detecting timing of the clock signal as an edge of the data signal, when one of the timing comparators receiving the clock signal samples the pair of sampling results, the pair of sampling results being used by one of the plurality of EOR circuits performing exclusive OR operation, the one of the EOR circuits outputting a logic value which indicates that the pair of sampling results are different from each other.

The plurality of timing comparators may include a first timing comparator group, which is a set of the plurality of timing comparators for sampling the data signal based on the clock signal, whose time delayed is a first delay time or less, and a second timing comparator group, which is a set of the plurality of the timing comparators for sampling the data signal based on the clock signal, whose time delayed is a second delay time or more, the plurality of EOR circuits may include a first EOR circuit group which is a set of the plurality of EOR circuits using sampling results of the plurality of timing comparators for exclusive OR operation, the plurality of timing comparators being included by the first timing comparator group and a second EOR circuit group which is a set of the plurality of EOR circuits using sampling results of the plurality of timing comparators for exclusive OR operation, the plurality of timing comparators being included by the second timing comparator group, the timing judging unit may include a first OR circuit for performing OR operation on operation results of the plurality of EOR circuits included by the first EOR circuit group and a second OR circuit for performing OR operation on operation results of the plurality of EOR circuits included by the second EOR circuit group, and the recovery variable delay circuit may change a delay amount of the clock signal generated by the reference clock generating circuit based on outputs of the first and second OR circuits.

The plurality of timing comparators may further include a third timing comparator group, which is a set of the plurality of timing comparators for sampling the data signal based on the clock signal, whose time delayed is larger than the first delay time and smaller than the second delay time, the plurality of EOR circuits may further include a third EOR circuit group which is a set of the plurality of EOR circuits used for exclusive OR operation on sampling results of the plurality of timing comparators included by the third timing comparator group, the timing judging unit may further include a third OR circuit for performing OR operation on operation results of the plurality of EOR circuits included by the third EOR circuit group, and the recovery variable delay circuit may not change a delay amount of the clock signal generated by the reference clock generating circuit, if the third OR circuit outputs a logical value "1".

The timing judging unit may further include a counter for counting a number of times each of the first and second OR circuits outputs the logic value "1", if each of the plurality of timing comparators performs sampling operation a plurality of times on each of the plurality of data signals at timing of each of the plurality of clock signals, while each of the plurality of EOR circuits performs exclusive OR operation a plurality of times and each of the first and second OR circuits performs OR operation a plurality of times, and the recovery variable delay circuit may change a delay amount of the clock signal generated by the reference clock generating circuit based on a count value of the counter.

The clock recovery circuit may further include plural stages of third variable delay elements coupled in series for sequentially delaying the clock signal generated by the reference clock generating circuit, the plural stages of third variable delay elements having substantially the same delay characteristics as the plural stages of first variable delay elements, a fourth variable delay element coupled in parallel to the plural stages of third variable delay elements for delaying the clock signal generated by the reference clock generating circuit, a phase comparator for comparing a phase of the clock signal delayed by the plural stages of third variable delay elements with a phase of the clock signal delayed by the fourth variable delay element, and a first delay amount control unit for controlling delay amounts of the plural stages of third variable delay elements and the plural stages of first variable delay elements based on a comparison result of the phase comparator in order that the phase of the clock signal delayed by the plural stages of third variable delay elements and the phase of the data signal delayed by the plural stages of first variable delay elements are substantially the same as a phase of the clock signal delayed by the fourth variable delay element after predetermined cycles.

The clock recovery circuit may further include plural stages of fifth variable delay elements coupled in series for sequentially delaying the clock signal generated by the reference clock generating circuit, the plural stages of third variable delay elements having substantially the same delay characteristics as the plural stages of first variable delay elements, a sixth variable delay element coupled in parallel to the plural stages of fifth variable delay elements for delaying the clock signal generated by the reference clock generating circuit, a phase comparator for comparing a phase of the clock signal delayed by the plural stages of fifth variable delay elements and a phase of the clock signal delayed by the sixth variable delay element, and a second delay amount control unit for controlling delay amounts of the plural stages of fifth variable delay elements and the plural stages of second variable delay elements based on a comparison result of the phase comparator in order that the phase of the clock signal delayed by the plural stages of fifth variable delay elements and the phase of the data signal delayed by the plural stages of second variable delay elements are substantially the same as a phase of the clock signal delayed by the sixth variable delay element after predetermined cycles.

Each of the plurality of timing comparators may include a dynamic D flip-flop circuit for latching and outputting the data signal received from the first variable delay circuit using parasitic capacitance thereof based on the clock signal received by the corresponding timing comparator, a buffer for delaying the clock signal received by the corresponding timing comparator as much as a predetermined time, and a D flip-flop circuit for latching and outputting an output signal outputted by the dynamic D flip-flop circuit based on the clock signal delayed by the buffer.

According to the second aspect of the present invention, a communication device for synchronously processing a data signal with a clock signal includes a reference clock generating circuit for generating the clock signal, a clock recovery circuit for adjusting timing of the clock signal to the data signal, and a reception terminal logic circuit for synchronously processing the data signal with the clock signal.

The clock recovery circuit includes plural stages of first variable delay elements coupled in series for sequentially delaying the data signal by a first delay amount, plural stages of second variable delay elements coupled in series for sequentially delaying the clock signal generated by a reference clock generating circuit as much as a second delay amount which is larger than the first delay amount, a plurality of timing comparators for sampling each of a plurality of the data signals delayed by each of the plural stages of first variable delay elements with the clock signal delayed by the second variable delay elements whose stages are respectively the same as the plural stages of first variable delay elements, a plurality of EOR circuits for performing exclusive OR operation respectively on sets of a plurality of the sampling results, a pair of sampling results by each of pairs of the sequential timing comparators being taken as one of the sets of a plurality of the sampling results, a timing judging unit for judging the timing of the clock signal generated by the reference clock generating circuit corresponding to the data signal based on an operation result of each of the plurality of EOR circuits, and are covery variable delay circuit for delaying the clock signal generated by the reference clock generating circuit based on a judgment result of the timing judging unit.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
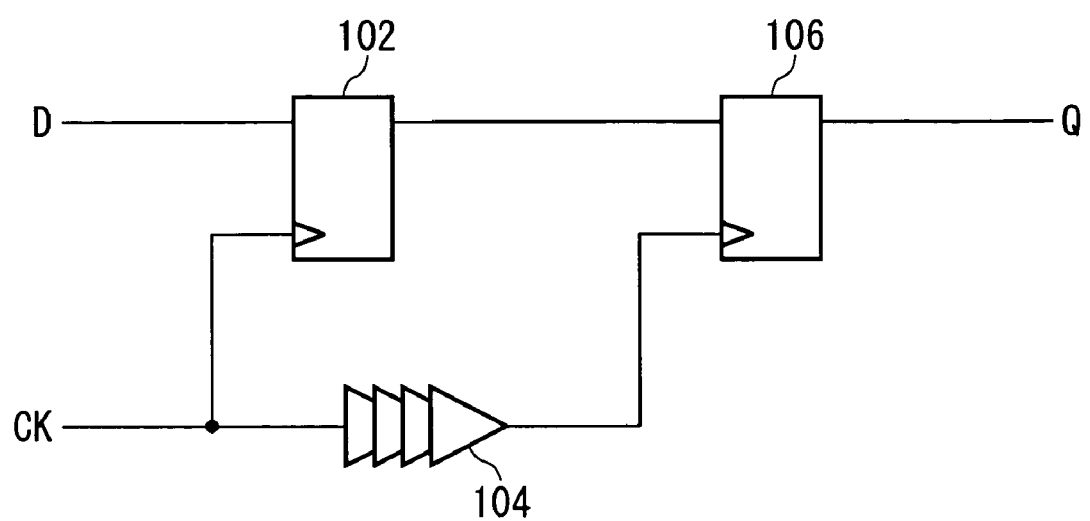
FIG. 1 shows an example of the configuration of a timing comparator.

FIG. 1 shows an example of the configuration of a timing comparator 100 according to this invention. The timing comparator 100 includes a dynamic D flip-flop circuit 102, a buffer 104 and a positive feedback D flip-flop circuit 106, and samples and outputs a data signal (D) by a clock signal (CK). The dynamic D flip-flop circuit 102 latches and outputs the data signal (D) by its parasitic capacitance based on the clock signal (CK) received by the timing comparator 100 and supplies it to the positive feedback D flip-flop circuit 106. The buffer 104 delays the clock signal (CK) received by the timing comparator 100 by a predetermined time and supplies it to the positive feedback D flip-flop circuit 106. The positive feedback D flip-flop circuit 106 latches and outputs the output signal outputted by the dynamic D flip-flop circuit 102 based on the clock signal (CK) delayed by the buffer 104 using its positive feedback circuit. The buffer 104 preferably delays the clock signal (CK) more than the hold time of the positive feedback D flip-flop circuit 106. Further, the positive feedback D flip-flop circuit 106 is an example of the D flip-flop circuit of this invention.

The timing comparator 100 includes the buffer 104, whereby it can allow the dynamic D flip-flop circuit 102 and the positive feedback D flip-flop circuit 106 not to perform a pipeline process but to operate as a delay line. In other words, the dynamic D flip-flop circuit 102 and the positive feedback D flip-flop circuit 106 can operate with the same clock signal.

Figure 2:
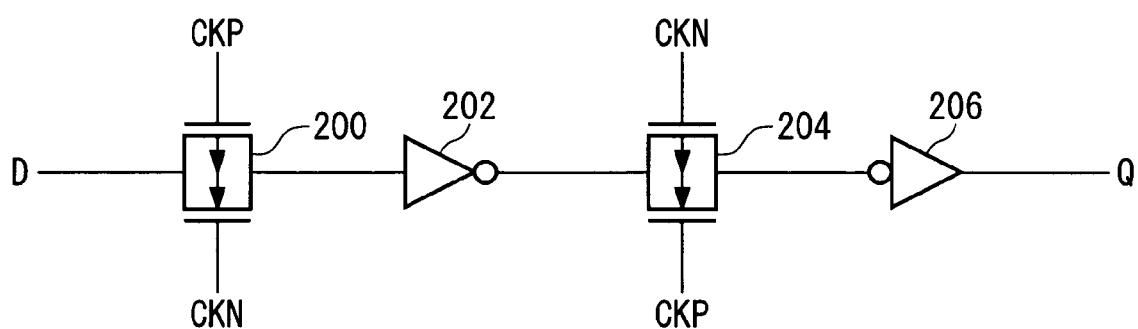
FIG. 2 shows an example of the configuration of a dynamic D flip-flop circuit.

FIG. 2 shows an example of the configuration of the dynamic D flip-flop circuit 102. The dynamic D flip-flop circuit 102 includes a first analog switch 200, a first inverter 202, a second analog switch 204, and a second inverter 206. The first analog switch 200 performs an on/off control based on the clock signal (CK) received by the timing comparator 100. The first inverter 202 inverts and outputs the signal passing through the first analog switch 200. The second analog switch 204 is coupled to the next stage of the first inverter 202 and performs the on/off control inverse to the on/off control of the first analog switch 200 based on the clock signal (CK) received by the timing comparator 100. The second inverter 206 inverts and outputs the signal passing through the second analog switch 204.

The first and second analog switches 200 and 204 are analog switches using P-channel/N-channel transistors and perform switching operation by CKP whose phase is the same as CK and CKN whose phase is inverse to it. And, the first and second inverters 202 and 206 are CMOS inverters. And the dynamic D flip-flop circuit 102 configures a sample-and-hold circuit by the analog switches, the first and second analog switches 200 and 204, and the parasitic capacitance such as the gate capacitance and the wiring capacitance of the first and second inverters 202 and 206.

Since the dynamic D flip-flop circuit 102 does not include a loop circuit, its logic output becomes an intermediate level between "H" and "L" levels unless the electric charge is sufficient. However, there is an advantage that the phase width to output the intermediate level is extremely small, and the width of the hysteresis is extremely small.

Figure 3:
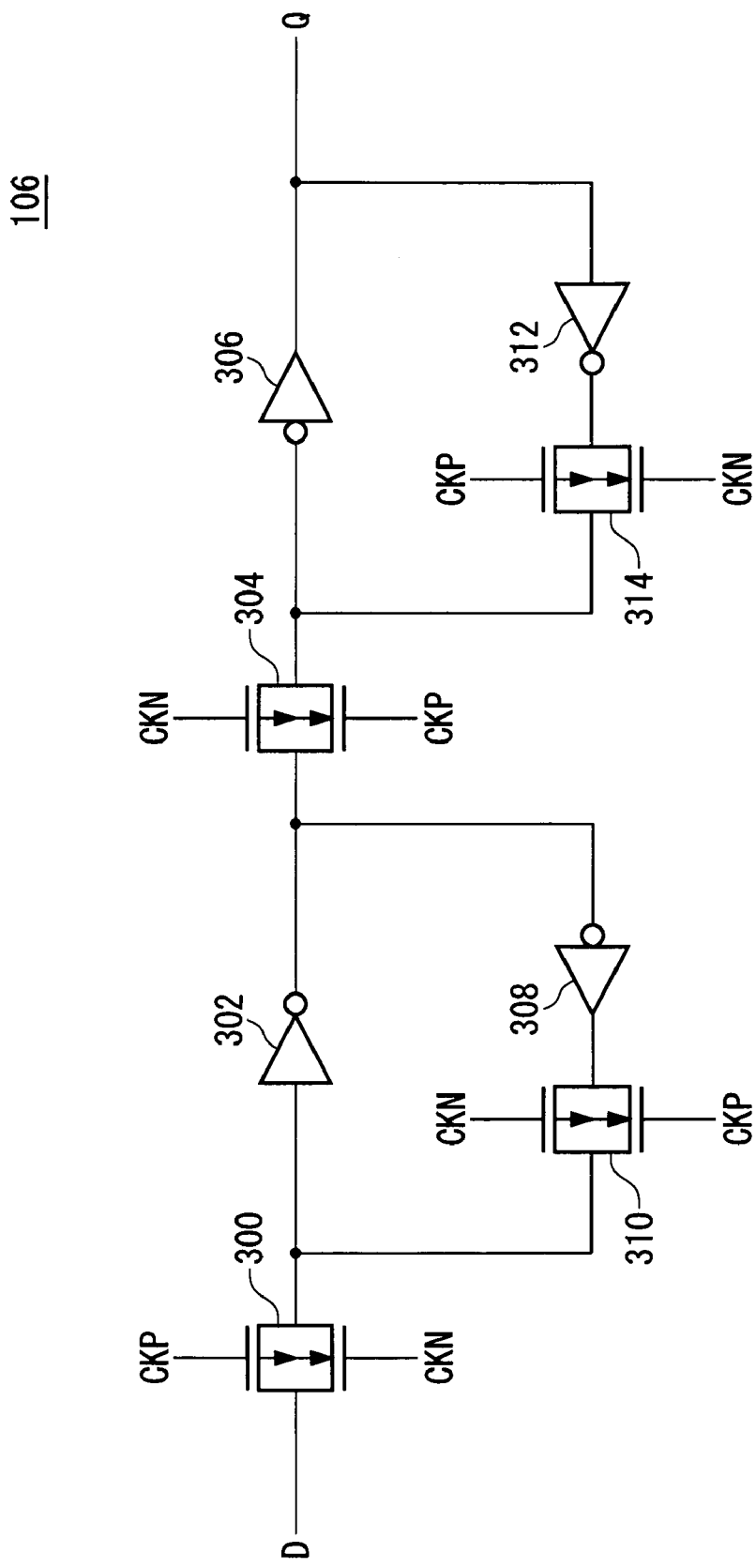
FIG. 3 shows an example of the configuration of a positive feedback D flip-flop circuit.

FIG. 3 shows an example of the configuration of the positive feedback D flip-flop circuit 106. The positive feedback D flip-flop circuit 106 includes a third analog switch 300, a third inverter 302, a fourth analog switch 304, a fourth inverter 306, a fifth inverter 308, a fifth analog switch 310, a sixth inverter 312, and a sixth analog switch 314.

The third analog switch 300 performs an on/off control based on the clock signal (CK) delayed by the buffer 104. The third inverter 302 inverts and outputs the signal passing through the third analog switch 300. The fourth analog switch 304 is coupled to the next stage of the third inverter 302, and performs the on/off control inverse to the on/off control of the third analog switch 300 based on the clock signal (CK) delayed by the buffer 104. The fourth inverter 306 inverts and outputs the signal passing through the fourth analog switch 304. The fifth inverter 308 inverts and outputs the signal passing through the third analog switch 302. The fifth analog switch 310, which is coupled to the next stage of the fifth inverter 308, performs the on/off control inverse to the on/off control of the third analog switch 300 based on the clock signal (CK) delayed by the buffer 104 and supplies the passing signal to the third inverter 302. The sixth inverter 312 inverts and outputs the signal passing through the fourth analog switch 306. The sixth analog switch 314, which is coupled to the next stage of the sixth inverter 312, performs the on/off control inverse to the on/off control of the fourth analog switch 304 based on the clock signal (CK) delayed by the buffer 104 and supplies the passing signal to the fourth inverter 306.

The third, fourth, fifth and sixth analog switches 300, 304, 310 and 314 are analog switches using P-channel/N-channel transistors and perform switching operation by CKP whose phase is the same as CK and CKN whose phase is inverse to it. The third, fourth, fifth and sixth inverters 302, 306, 308 and 312 are CMOS inverters. And the positive feedback D flip-flop circuit 106 holds the output of the third analog switch 300 by the loop circuit which consists of the third and fifth inverters 302 and 308 and the fifth analog switch 310, while holding the output of the fourth analog switch 304 which consists of the fourth and sixth inverters 306 and 312 and the sixth analog switch 314.

The positive feedback D flip-flop circuit 106 amplifies and outputs the signal by its positive feedback circuit. Accordingly, if the data signal (D) of an intermediate level is inputted from the dynamic D flip-flop circuit 102, hysteresis occurs. However, the width of the hysteresis is such that the logic output of the dynamic D flip-flop circuit 102 becomes the intermediate level, so it is extremely small. Therefore, according to the timing comparator 100 related to this invention, the logic output of an intermediate level is not outputted, and thus the time required until the phase is locked can be reduced, so it is possible to correspond to a higher frequency band.

Figure 4:
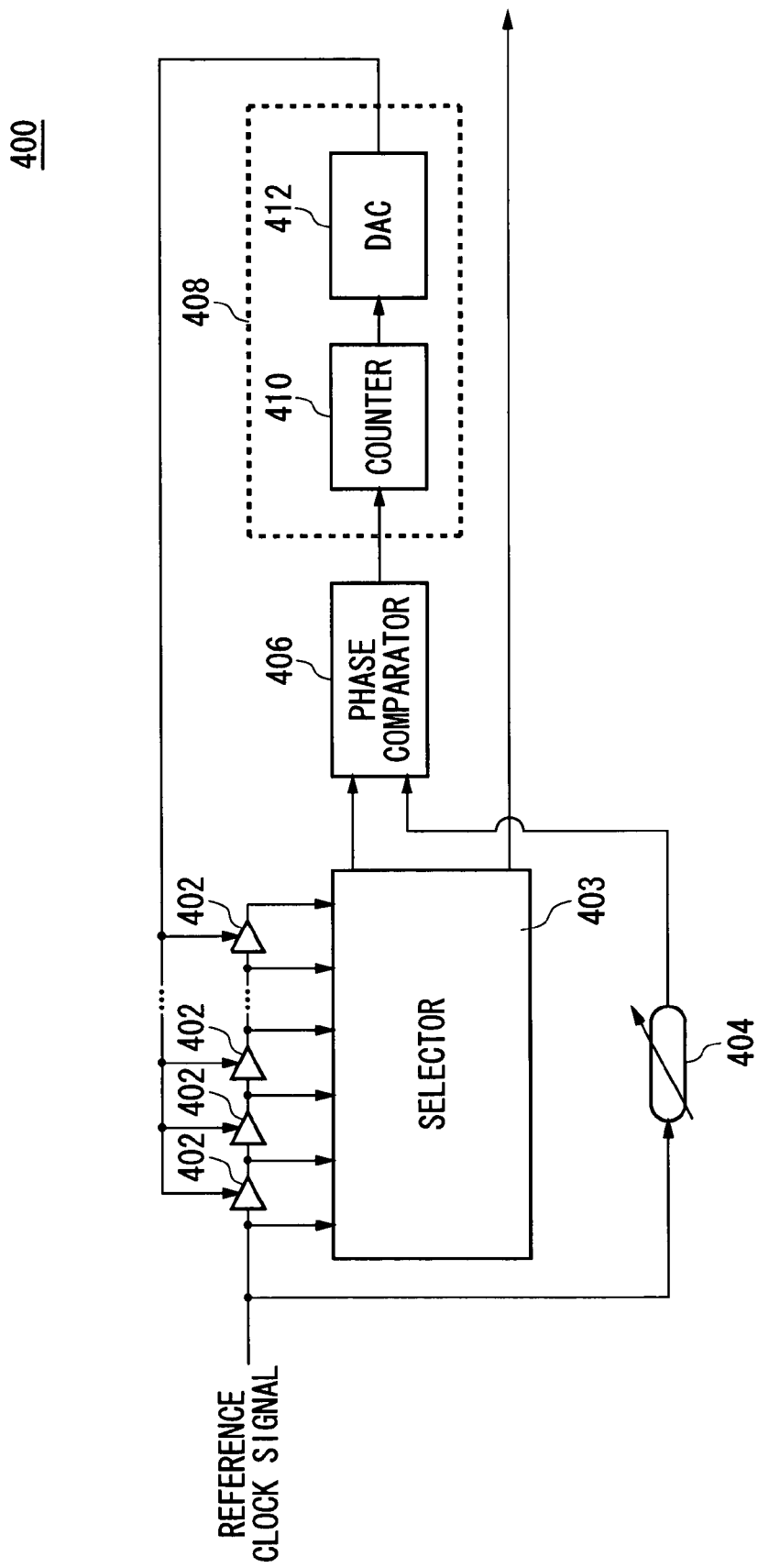
FIG. 4 shows an example of the configuration of a variable delay circuit.

FIG. 4 shows an example of the configuration of a variable delay circuit 400 according to this invention. The variable delay circuit 400 is a DLL (Delay Lock Loop) circuit and delays and outputs a reference clock signal by a designated time. The variable delay circuit 400 includes plural stages of variable delay elements 402, a selector 403, a variable delay element 404, a phase comparator 406, and a delay amount control unit 408. The delay amount control unit 408 includes a counter 410 and a DAC 412.

The plural stages of variable delay elements 402 which are coupled in series sequentially delay the reference clock signal and supply it to the selector 403. The selector 403 selects one reference clock signal among a plurality of reference clock signals or data signals outputted by the plural stages of variable delay elements 402 in a reciprocally independent manner and supplies it to the phase comparator 406, while selecting one reference clock signal among a plurality of reference clock signals or data signals outputted by the plural stages of variable delay elements 402 and supplying it out of the variable delay circuit 400. The variable delay element 404 which is coupled in parallel to the plural stages of variable delay elements 402 delays the reference clock signal. And the phase comparator 406 compares the phase of the reference clock signal delayed by the plural stages of variable delay elements 402, supplied from the selector 403, with the phase of the reference clock signal delayed by the variable delay element 404. The delay amount control unit 408 controls the delay amount of each of the plural stages of variable delay elements 402 based on the comparison result of the phase comparator 406 in order that the phase of the reference clock signal delayed by the plural stages of variable delay elements 402, supplied from the selector 403, is approximately the same as the phase of the reference clock signal delayed by the variable delay element 404 for each of predetermined cycles.

Particularly, the phase comparator 406 outputs a flag signal that indicates whether the phase of the reference clock signal delayed by the plural stages of variable delay elements 402 is early or late relatively to the phase of the reference clock signal delayed by the variable delay element 404. And the counter 410 increases the count value if the flag signal outputted from the phase comparator 406 indicates that the phase of the reference clock signal delayed by the plural stages of variable delay elements 402 is early, whereas decreasing the count value if the flag signal indicates that it is late. And the DAC 412 supplies a bias signal to control the delay amounts for the plural stages of variable delay elements 402 based on the count value of the counter 410. Here, the delay time per one stage of the variable delay elements 402 is determined by the following equation:

$$\begin{aligned}&\text{(the delay amount of one stage of the variable delay elements 402)} =\\ &\quad ((\text{the period of the reference clock signal}) -\\ &\quad (\text{the delay amount of the variable delay element 404})) /\\ &\quad (\text{the number of the stages of the variable}\\ &\quad \text{delay elements 402 used in the } DLL).\end{aligned}$$

According to the variable delay circuit 400 related to this invention, since the variable amounts of the propagation delay time of the plural stages of variable delay elements 402 caused by the change of processes or the environmental change such as voltage or temperature can be assigned to the lock range of the DLL, each of the variable delay elements 402 has its variable amount as much as (the delay amount of the variable delay element 404))/(the number of the stages of the variable delay elements 402 used in the DLL), and thus it is possible to absorb the deviation of the propagation delay time of the plural stages of variable delay elements 402 caused by the change of processes or the environmental change such as voltage or temperature. Further, the width of the period of the reference clock signal which can be delayed can be increased, and even if the period of the reference clock signal changes, it is possible to easily correspond to such situation simply by the process of software without correcting any circuits.

Figure 5:
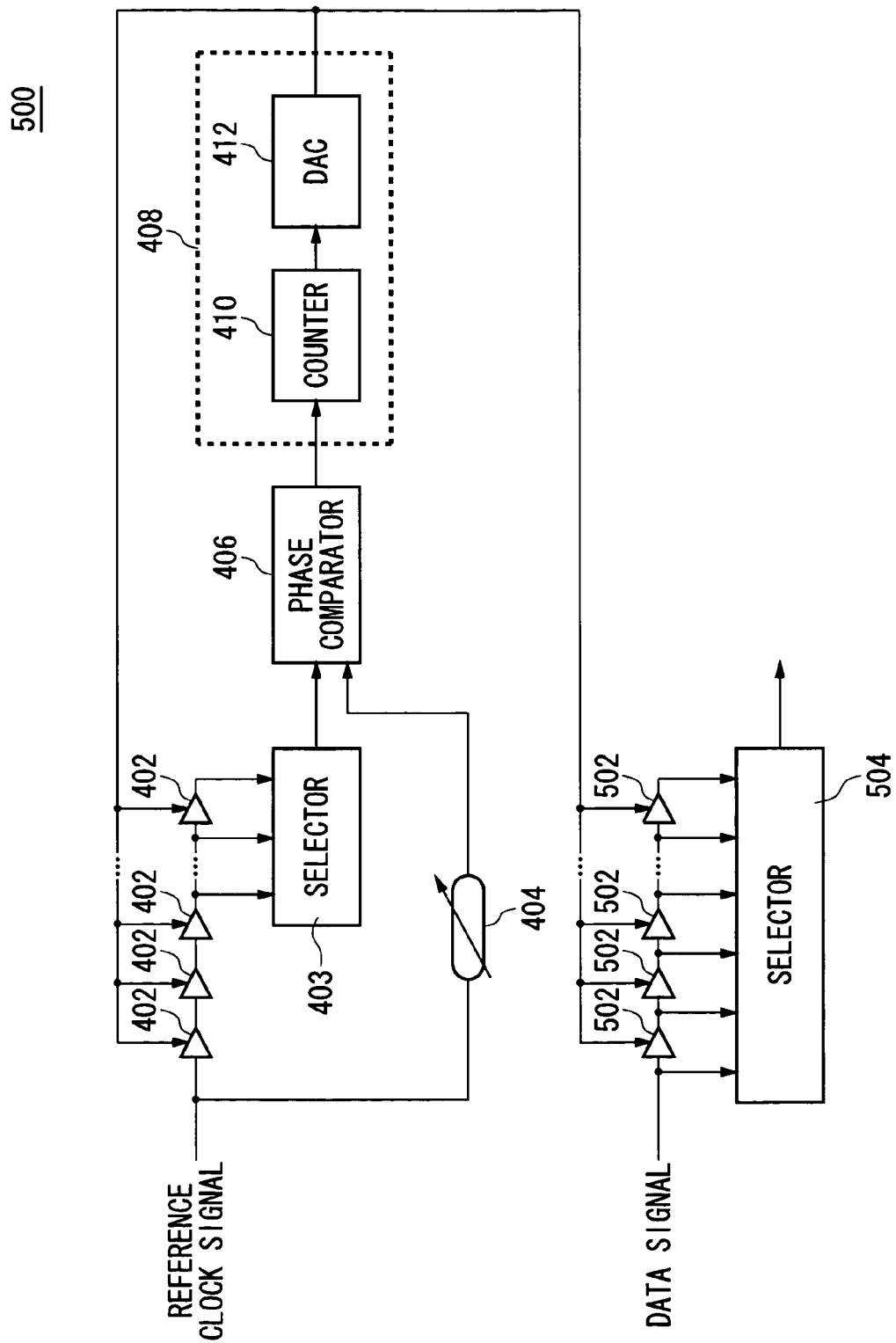
FIG. 5 shows an example of the configuration of a variable delay circuit.

FIG. 5 shows an example of the configuration of a variable delay circuit 500 according to this invention. The variable delay circuit 500 includes a DLL circuit which is an example of the variable delay circuit 400 shown in FIG. 4 and delays the data signal by a predetermined time and outputs it. The variable delay circuit 500 includes plural stages of variable delay elements 502 and a selector 504 in addition to the configuration elements of the variable delay circuit 400 shown in FIG. 4.

The plural stages of variable delay elements 502 which have approximately the same delay characteristics as the plural stages of variable delay elements 402 are coupled in series and sequentially delay the data signal. By decreasing the number of the stages of the variable delay elements 402 to such a limit as the number of the stages required for the delay time as much as the period of the reference clock signal, the circuit size can be reduced. And the selector 504 selects one of the data signals outputted by the plural stages of variable delay elements 502 and outputs it out of the variable delay circuit 500.

The delay amount control unit 408 controls the delay amount of each of the plural stages of variable delay elements 402 based on the comparison result of the phase comparator 406 in order that the phase of the reference clock signal delayed by the plural stages of variable delay elements 402 is approximately equal to the phase of the reference clock signal delayed by the variable delay element 404 after predetermined cycles, while controlling the delay amount of each of the plural stages of variable delay elements 402 in order that the phase of the reference clock signal delayed by the plural stages of variable delay elements 502 is approximately equal to the phase of the reference clock signal delayed by the variable delay element 404 after predetermined cycles. For example, the delay amount control unit 408 controls the delay amount by supplying a first control signal to each of the plural stages of variable delay elements 402, whereas controlling the delay amount by supplying a second control signal uniquely determined from the first control signal to each of the plural stages of variable delay elements 502. Moreover, if the plural stages of variable delay elements 502 and the plural stages of variable delay elements 402 are the same in the number of stages, the delay amount control unit 408 may control the plural stages of variable delay elements 402 and the plural stages of variable delay elements 502 to have approximately the same delay amount by supplying the first control signal to each of the plural stages of variable delay elements 402 where as supplying the second control signal which is the same as the first control signal to each of the plural stages of variable delay elements 502.

Figure 6:
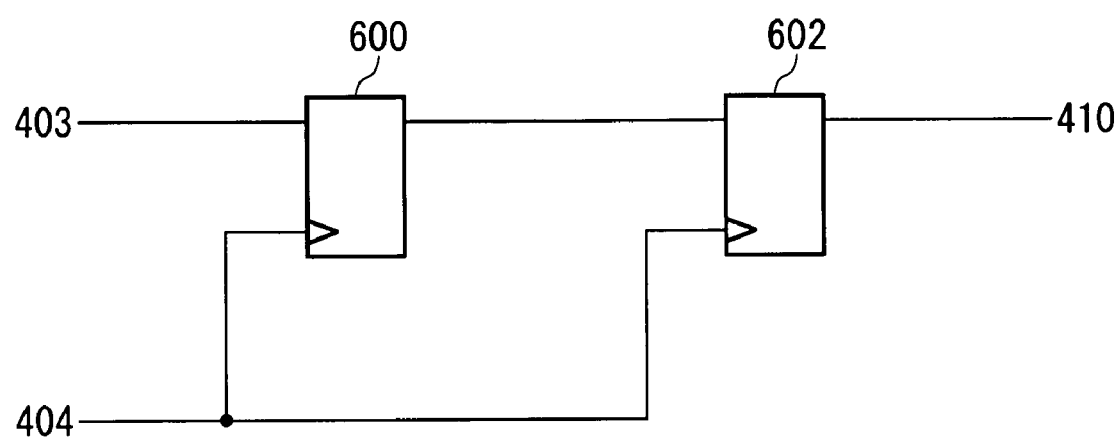
FIG. 6 shows an example of the configuration of a phase comparator.

FIG. 6 shows an example of the configuration of a phase comparator 406. The phase comparator 406 includes a dynamic D flip-flop circuit 600 and a positive feedback D flip-flop circuit 602. The dynamic D flip-flop circuit 600 latches and outputs the reference clock signal delayed by the plural stages of variable delay elements 402 by its parasitic capacitance based on the reference clock signal delayed by the variable delay element 404. The positive feedback D flip-flop circuit 602 latches and outputs the output signal outputted by the dynamic D flip-flop circuit 600 by its positive feedback circuit based on the reference clock signal delayed by the variable delay element 404.

The dynamic D flip-flop circuit 600 has the same configuration and function as the dynamic D flip-flop circuit 102 shown in FIG. 2, and the positive feedback D flip-flop circuit 602 has the same configuration and function as the positive feedback D flip-flop circuit 106 shown in FIG. 3, so they will not be described.

Figure 7:
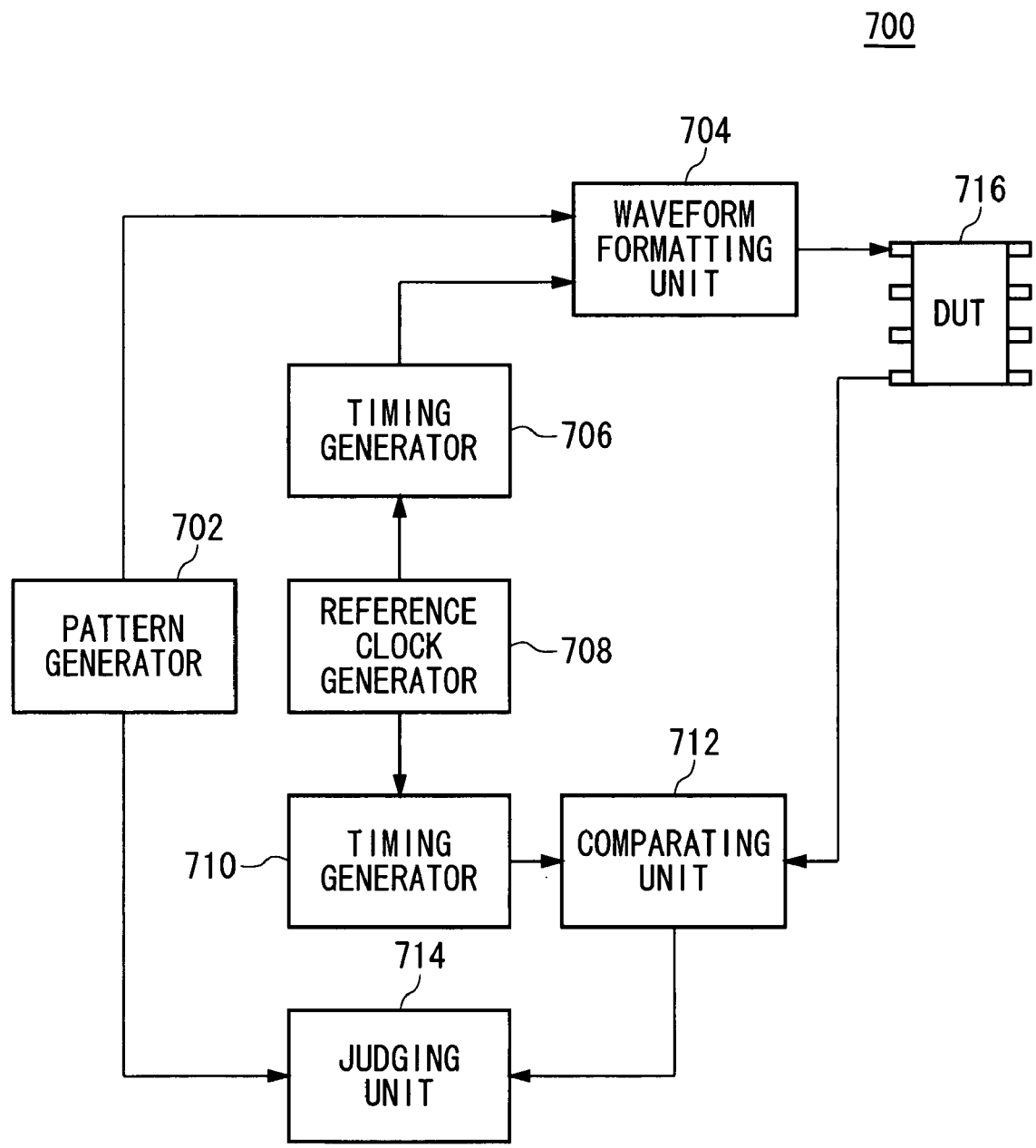
FIG. 7 shows an example of the configuration of a testing apparatus.

FIG. 7 shows an example of the configuration of the testing apparatus 700 according to a first exemplary embodiment of this invention. The testing apparatus 700 includes a pattern generator 702, a waveform formatting unit 704, a timing generator 706, a reference clock generator 708, a timing generator 710, a comparing unit 712, and a judging unit 704. The pattern generator 702 generates the data signal to be supplied to the device under test 716 and supplies it to the waveform formatting unit 704. And the reference clock generator 708 generates an expected value signal required to judge the quality of the device under test 716 and supplies it to the judging unit 704. The timing generator 706 generates a strobe signal that indicates the timing at which the waveform formatting unit 704 should supply the data signal to the device under test 716 based on the reference clock signal generated by the reference clock generator 708. And the timing generator 710 generates a strobe signal that indicates the timing at which the comparing unit 712 should sample the data signal outputted from the device under test 716 based on the reference clock signal generated by the reference clock generator 708.

The waveform formatting unit 704 formats the waveform of the data signal generated by the pattern generator 702 and supplies the data signal to the device under test 716 based on the strobe signal generated by the timing generator 706. The device under test 716 outputs the data signal in response to the data signal supplied. And the comparing unit 712 samples the data signal outputted from the device under test 716 by the strobe signal generated by the timing generator 710. And the judging unit 714 judges the quality of the device under test 716 by comparing the sampling result of the comparing unit 702 with the expected value signal generated by the pattern generator 702.

Figure 8:
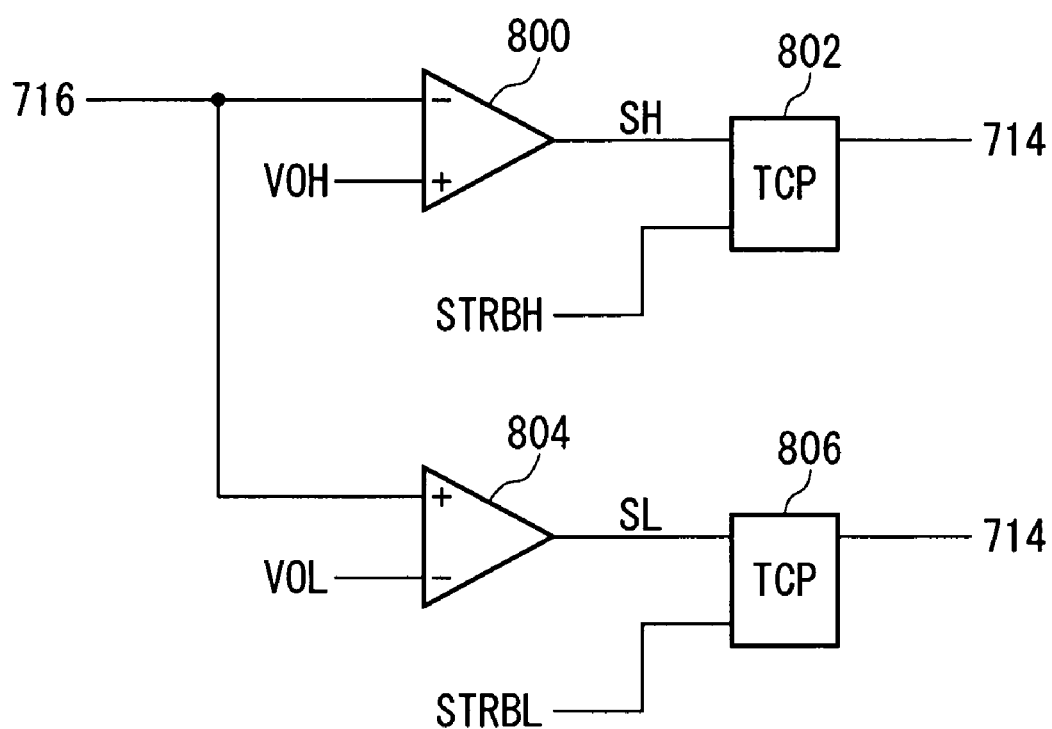
FIG. 8 shows an example of the configuration of a comparing unit.

FIG. 8 shows an example of the configuration of the comparing unit 712. The comparing unit 712 includes an H-side level comparator 800, an H-side timing comparator 802, an L-side level comparator 804, and an L-side timing comparator 806. The H-side level comparator 800 compares the data signal outputted from the device under test 716 with an H-side threshold value (VOH) and outputs the comparison result (SH). For example, the H-side level comparator 800 outputs a logic value "0" if the data signal outputted from the device under test 716 is larger than the H-side threshold value (VOH), whereas outputting a logic value "1" if the data signal outputted from the device under test 716 is smaller than the H-side threshold value (VOH). And the L-side level comparator 804 compares the data signal outputted from the device under test 716 with an L-side threshold value (VOL) and outputs the comparison result (SL). For example, the L-side level comparator 804 outputs the logic value "0" if the data signal outputted from the device under test 716 is smaller than the L-side threshold value (VOL), whereas outputting the logic value "1" if the data signal outputted from the device under test 716 is larger than the L-side threshold value (VOL).

The H-side timing comparator 802 samples the comparison result (SH) of the H-side level comparator 800 with an H-side strobe signal (STRBH) generated by the timing generator 710 and outputs the sampling result to the judging unit 714. The L-side timing comparator 80 samples the comparison result (SL) of the L-side level comparator 804 with an L-side strobe signal (STRBL) generated by the timing generator 710 and outputs the sampling result to the judging unit 714.

The H-side and L-side timing comparators 802 and 806 have the same configuration and function as the timing comparator 100 shown in FIG. 1, so they will be described. Since the H-side and L-side timing comparators 802 and 806 have the same configuration and function as the timing comparator 100 shown in FIG. 1, it is possible to sample the data signal outputted from the device under test 716 with high precision, and thus the device under test 716 can be accurately tested.

Figure 9:
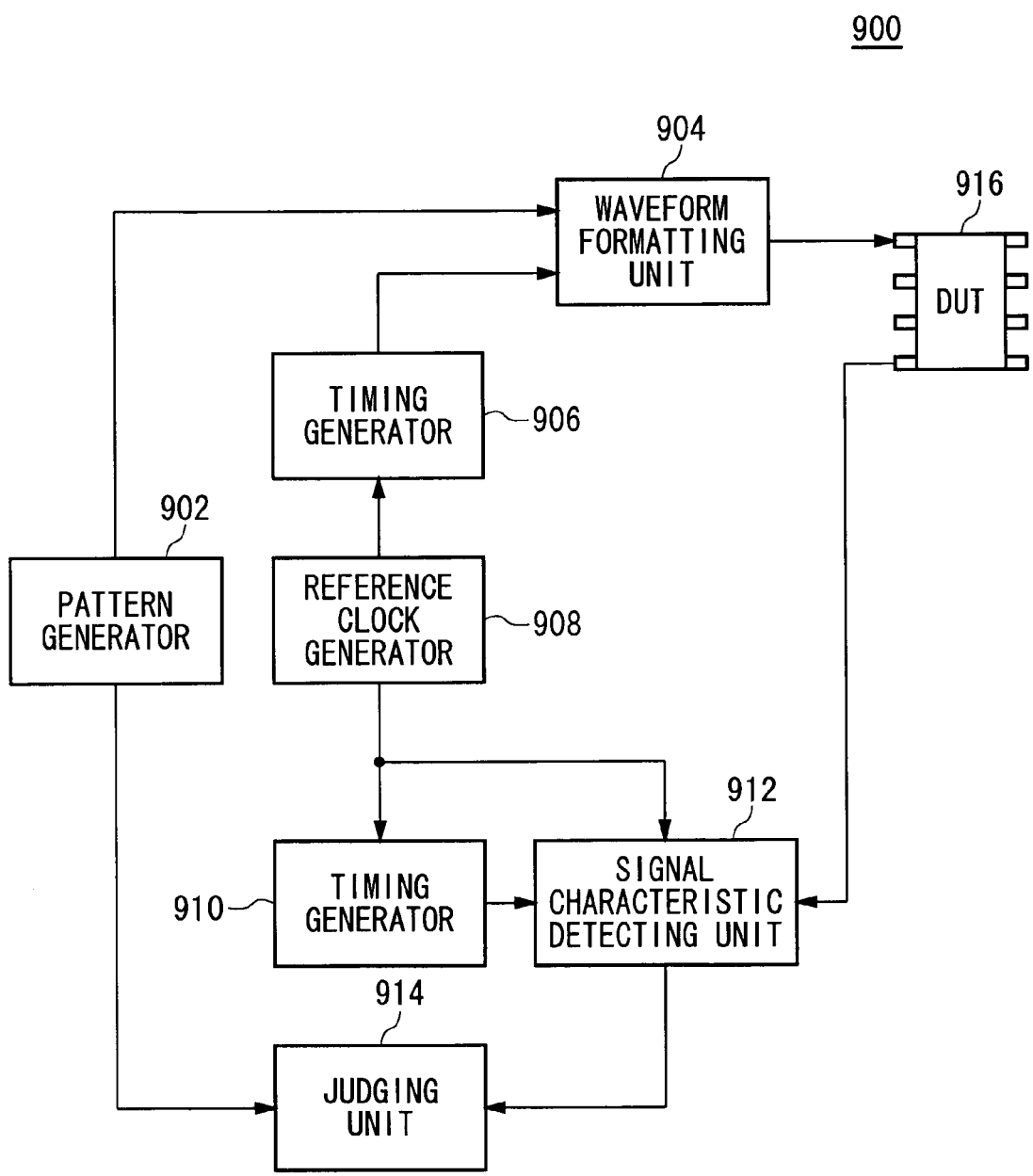
FIG. 9 shows an example of the configuration of a testing apparatus.

FIG. 9 shows an example of the configuration of a testing apparatus 900 according to a second exemplary embodiment of this invention. The testing apparatus 900 includes a pattern generator 902, a waveform formatting unit 904, a timing generator 906, a reference clock generator 908, a timing generator 910, a signal characteristic detecting unit 912, and a judging unit 914. The pattern generator 902 generates a data signal to be supplied to a device under test 916 and supplies it to the waveform formatting unit 904. And the reference clock generator 908 generates an expected value signal required to judge the quality of the device under test 916 and supplies it to the judging unit 914. The reference clock generator 908 generates the reference clock signal and supplies it to the timing generator 906, the timing generator 910 and the signal characteristic detecting unit 912. The timing generator 906 generates a strobe signal that indicates the timing at which the waveform formatting unit 904 should supply the data signal to the device under test 916 based on the reference clock signal generated by the reference clock generator 908. And the timing generator 910 generates a strobe signal that indicates the timing at which the signal characteristic detecting unit 912 should sample the data signal outputted from the device under test 916 based on the reference clock signal generated by the reference clock generator 908.

The waveform formatting unit 904 formats the wave form of the data signal generated by the pattern generator 902 and supplies the data signal to the device under test 916 based on the strobe signal generated by the timing generator 906. The device under test 916 outputs the data signal in response to the data signal supplied. And the signal characteristic detecting unit 912 samples the data signal outputted from the device under test 916 by the strobe signal generated by the timing generator 910 and detects the signal characteristics of the data signal outputted from the device under test 916. And the judging unit 914 judges the quality of the device under test 916 by comparing the detection result of the signal characteristic detecting unit 912 with the expected value signal generated by the pattern generator 902.

Figure 10:
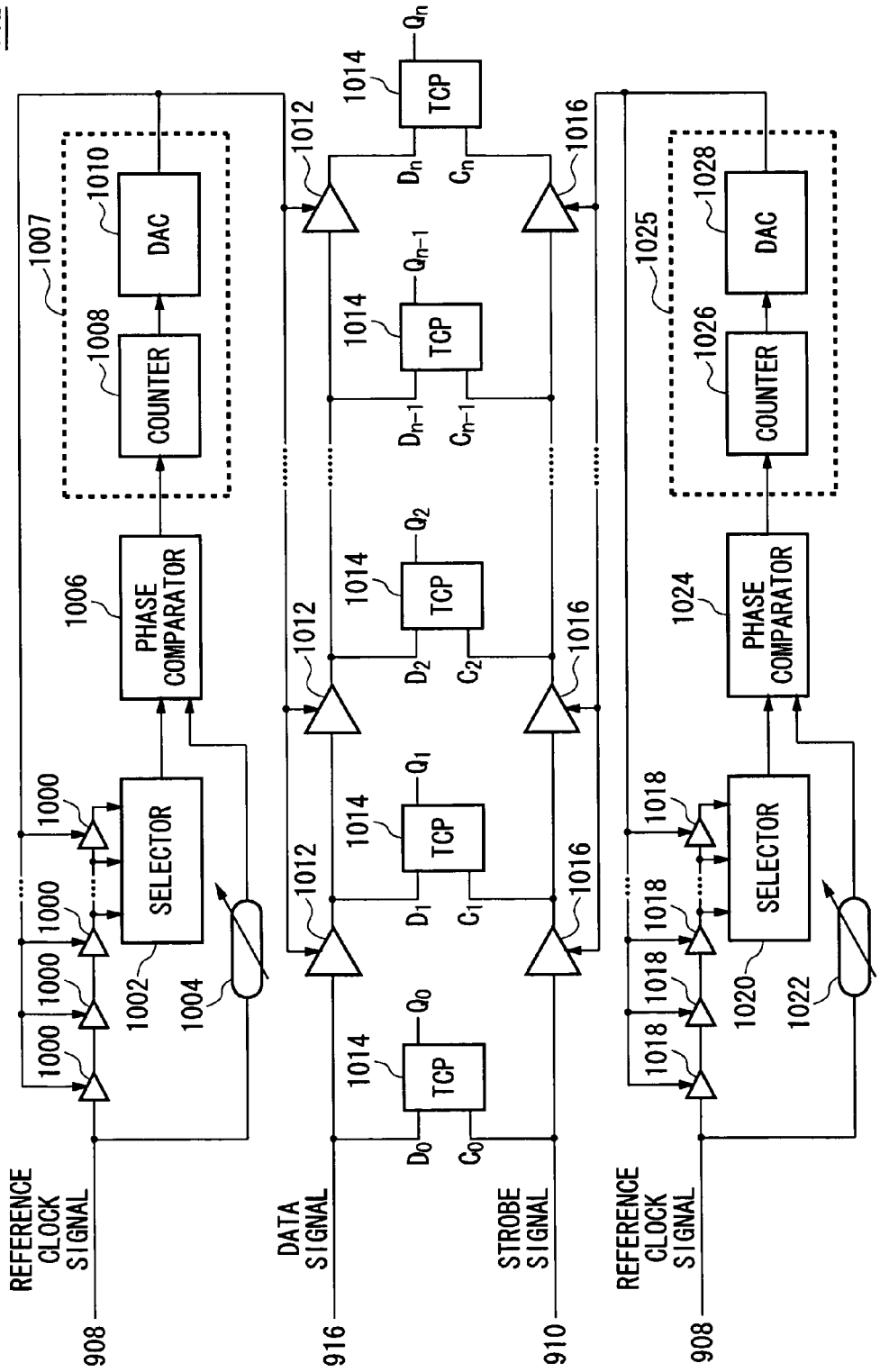
FIG. 10 shows an example of the configuration of a signal characteristic detecting unit.

FIG. 10 shows an example of the configuration of the signal characteristic detecting unit 912. The signal characteristic detecting unit 912 includes plural stages of variable delay elements 1000, a selector 1002, a variable delay element 1004, a phase comparator 1006, a delay amount control unit 1007, plural stages of variable delay elements 1012, a plurality of timing comparators 1014, plural stages of variable delay elements 1016, plural stages of variable delay elements 1018, a selector 1020, a variable delay element 1022, a phase comparator 1024, and a delay amount control unit 1025. The delay amount control unit 1007 includes a counter 1008 and a DAC 1010, and the delay amount control unit 1025 includes a counter 1026 and a DAC 1028. And the signal characteristic detecting unit 912 is an example of the data sampling apparatus of this invention.

The plural stages of variable delay elements 1012 which are coupled in series sequentially delay the data signal outputted from the device under test 916 by a delay amount T. And the plural stages of variable delay elements 1016 which are coupled in series sequentially delay the strobe signal outputted from the timing generator 910 by a delay amount T+Δt which is larger than the delay amount T. And the plurality of timing comparators 1014 sample each of a plurality of the data signals, whose delay amounts are different, delayed by each of the plural stages of variable delay elements 1012 by the strobe signal delayed by the variable delay elements 1016 whose stage is the same as each of the plural stages of variable delay elements 1012. And the signal characteristic detecting unit 912 detects the phase of the data signal outputted from the device under test 916 based on the sampling result by each of the plurality of timing comparators 1014.

Further, each of the plurality of timing comparators 1014, which has the same configuration and function as the timing comparator 100 shown in FIG. 1, samples each of the plurality of data signals (D0, D1, D2, . . . Dn−1, Dn), whose delay amounts are different, by each of the plurality of strobe signals C0, C1, C2, . . . Cn−1, Cn), whose delay amounts are different, and outputs the sampling result (Q0, Q1, Q2, . . . Qn−1, Qn). In this way, by using the timing comparators 1014 with the same proofreading and function as the timing comparator 100 shown in FIG. 1, it is possible to correspond to a higher frequency band and to reduce the skew at the rising or falling edge of the sampling signal.

And the plural stages of variable delay elements 1000 which are coupled in series sequentially delay the reference clock signal outputted by the reference clock generator 908 and supply it to the selector 1002. In addition, the plural stages of variable delay elements 1000 have approximately the same characteristics as the plural stages of variable delay elements 1012. And the selector 1002 selects one reference clock signal among a plurality of reference clock signals or data signals outputted by the plural stages of variable delay elements 1000 and supplies it to the phase comparator 1006. And the variable delay element 1004 which is coupled in series to the plural stages of variable delay elements 1000 delays the reference clock signal outputted by the reference clock generator 908 as much as the delay amount predetermined and supplies it to the phase comparator 1006.

The phase comparator 1006 compares the phase of the reference clock signal delayed by the plural stages of variable delay elements 1000, supplied from the selector 1002, with the phase of the reference clock signal delayed by the variable delay element 1004. And the delay amount control unit 1007 controls the delay amounts of the plural stages of variable delay elements 1000 and the delay amounts of the plural stages of variable delay elements 1012 based on the comparison result of the phase comparator 1006 in order that the phase of the reference clock signal delayed by the plural stages of variable delay elements 1000, supplied from the selector 1002, and the phase of the data signal delayed by the plural stages of variable delay elements 1012 are approximately equal to the phase of the reference clock signal delayed by the variable delay element 1004 after predetermined cycles.

And the plural stages of variable delay elements 1018 which are coupled in series sequentially delay the reference clock signal outputted by the reference clock generator 908 and supply it to the selector 1020. Further, the plural stages of variable delay elements 1018 have the same delay characteristics as the plural stages of variable delay elements 1016. And the selector 1020 selects one of the reference clock signals outputted by the plural stages of variable delay elements 1018 and supplies it to the phase comparator 1024. And the variable delay element 1022 which is coupled in parallel to the plural stages of variable delay elements 1018 delays the reference clock signal outputted by the reference clock generator 908 as much as the delay amount predetermined and supplies it to the phase comparator 1024.

The phase comparator 1024 compares the phase of the reference clock signal delayed by the plural stages of variable delay elements 1018, supplied from the selector 1020, with the phase of the reference clock signal delayed by the variable delay element 1022. And the delay amount control unit 1025 controls the delay amounts of the plural stages of variable delay elements 1018 and the delay amounts of the plural stages of variable delay elements 1016 based on the comparison result of the phase comparator 1024 in order that the phase of the reference clock signal delayed by the plural stages of variable delay elements 1018, supplied from the selector 1020, and the phase of the data signal delayed by the plural stages of variable delay elements 1016 are approximately equal to the phase of the reference clock signal delayed by the variable delay element 1022 after predetermined cycles.

Further, each of the variable delay elements 1000, the selector 1002, the variable delay element 1004, the phase comparator 1006, the delay amount control unit 1007, the counter 1008, the DAC 1010, and the variable delay elements 1012 has the same configuration and function as each of the variable delay elements 402, the selector 403, the variable delay element 404, the phase comparator 406, the delay amount control unit 408, the counter 410, the DAC 412, and the variable delay elements 502 shown in FIG. 5. And each of the variable delay elements 1018, the selector 1020, the variable delay element 1022, the phase comparator 1024, the delay amount control unit 1025, the counter 1026, the DAC 1028, and the variable delay elements 1016 has the same configuration and function as each of the variable delay elements 402, the selector 403, the variable delay element 404, the phase comparator 406, the delay amount control unit 408, the counter 410, the DAC 412, and the variable delay elements 502 shown in FIG. 5 and functions as a multi-strobe generating circuit for generating a plurality of strobe signals whose delay times are different.

Figure 11:
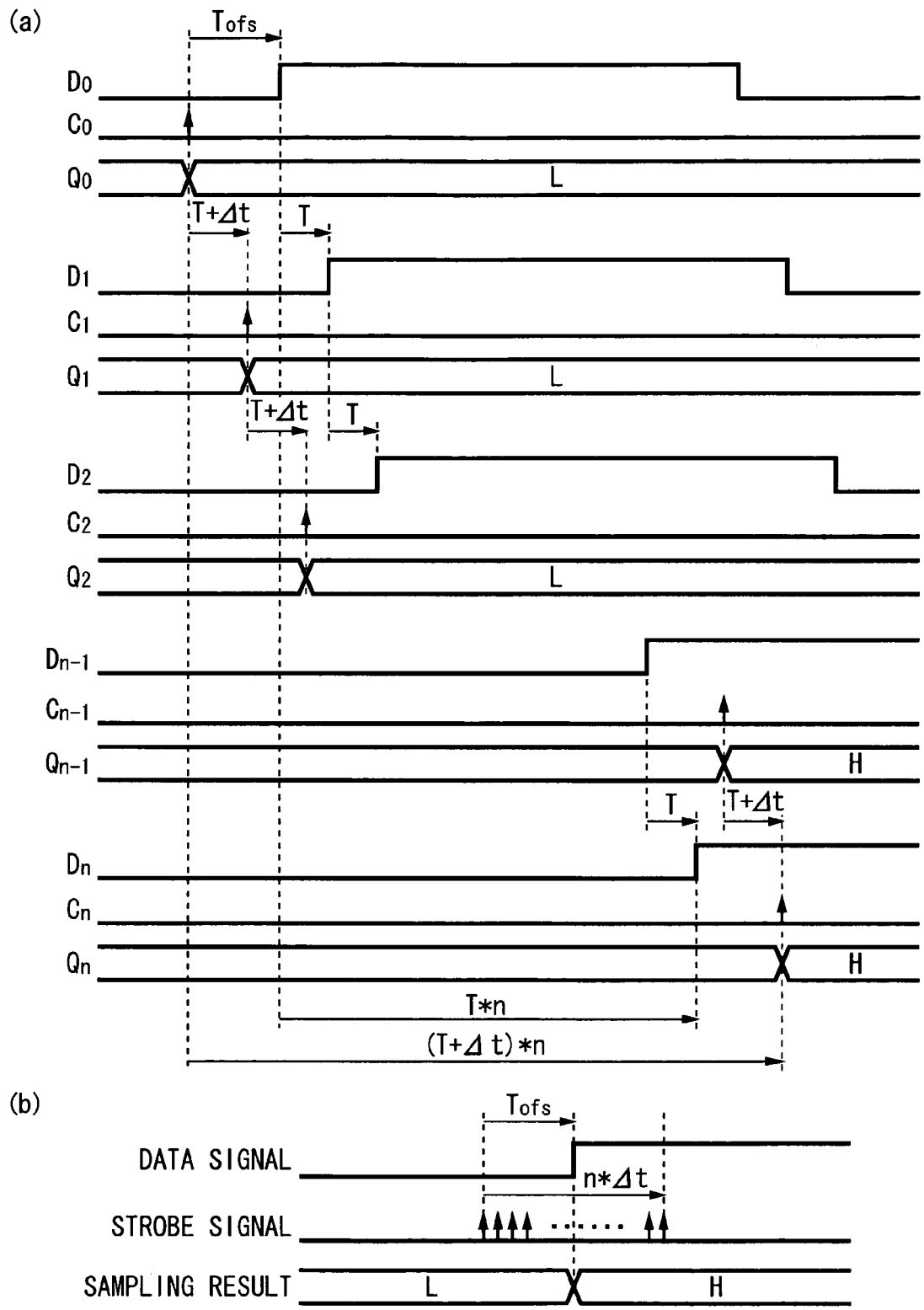
FIG. 11 shows an example of the phase detection operation by a signal characteristic detecting unit.

FIG. 11 shows an example of the phase detection operation by the signal characteristic detecting unit 912. FIG. 11(*a*) shows the input and output signals of a plurality of timing comparators 1014. FIG. 11(*b*) shows the outline of the phase detection operation.

The timing comparator 1014 of the first stage samples the data signal (D0) outputted from the device under test 916 by the strobe signal (C0), whose phase is earlier than the change point of the data signal (D0) as much as Tofs, generated by the timing generator 910 and outputs the sampling result (Q0). In this embodiment, since the data signal (D0) at the timing of the strobe signal (C0) is "L", the sampling result (Q0) is "L".

The timing comparator 1014 of the second stage samples the data signal (D1), which results from delaying the data signal (D0) as much as the delay amount T by the variable delay element 1012 of the first stage, by the strobe signal (C1), which results from delaying the strobe signal (C0) as much as the delay amount T+Δt by the variable delay element 1016 of the first stage, and outputs the sampling result (Q1). In this embodiment, since the data signal (D1) at the timing of the strobe signal (C1) is "L", the sampling result (Q1) is "L".

The timing comparator 1014 of the third stage samples the data signal (D2), which results from further delaying the data signal (D1) as much as the delay amount T by the variable delay element 1012 of the second stage, by the strobe signal (C2), which results from further delaying the strobe signal (C1) as much as the delay amount T+Δt by the variable delay element 1016 of the second stage, and outputs the sampling result (Q2). In this embodiment, since the data signal (D2) at the timing of the strobe signal (C2) is "L", the sampling result (Q2) is "L".

In this way, the plurality of timing comparators 1014 sample the plurality of data signals (D0, D1, D2, ... Dn−1, Dn) by the plurality of strobe signal (C0, C1, C2, ... Cn−1, Cn) respectively and output the sampling results (Q0, Q1, Q2, ... Qn−1, Qn).

The timing comparator 1014 of the n-th stage samples the data signal (Dn), which results from delaying the data signal (Dn−1) as much as the delay amount T by the variable delay element 1012 of the n-th stage, by the strobe signal (Cn), which results from delaying the strobe signal (Cn−1) as much as the delay amount T+Δt by the variable delay element 1016 of the n-th stage, and outputs the sampling result (Qn). In this embodiment, since the data signal (Dn) at the timing of the strobe signal (Cn) is "H", the sampling result (Q2) is "H".

In other words, the judging unit 914 retrieves the sampling results (Q0, Q1, Q2, ... Qn−1, Qn) of the plurality of timing comparators 1014 and plots them, so that it can realize the same function of detecting the change point of the data signal by supplying a plurality of strobe signals (C0, C1, C2, ... Cn−1, Cn) over the change point of the data signal outputted from the device under test 916 and sampling the data signal by each of the plurality of strobe signals (C0, C1, C2, ... Cn−1, Cn) as shown in FIG. 11(b). Further, according to the testing apparatus 700 related to this embodiment, since the phase of the data signal can be detected by the test process of one pass, i.e. simply by outputting the data signal to the device under test 916 once, it is possible to perform the test of the device under test 916 in extremely short time.

Figure 12:
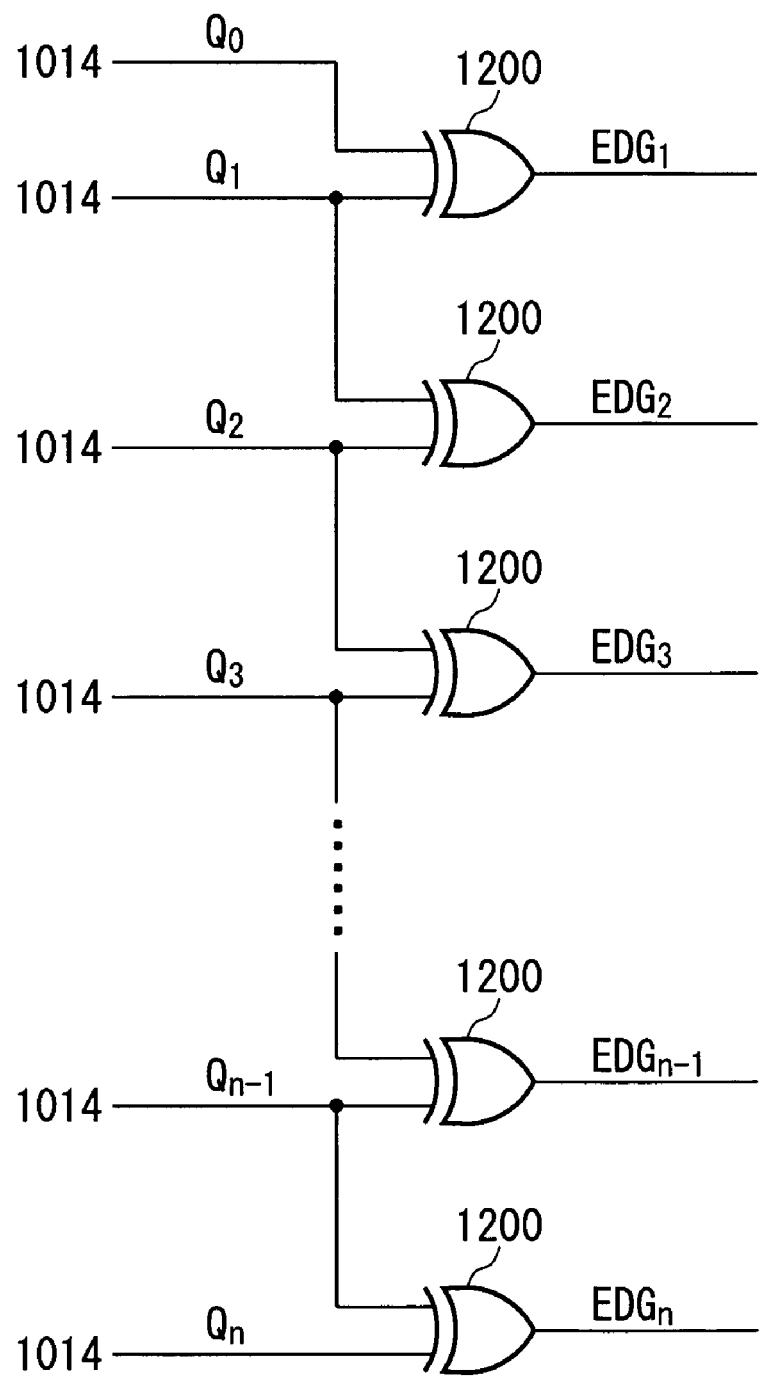
FIG. 12 shows an example of the configuration of the signal characteristic detecting unit.

FIG. 12 shows an example of the configuration of the signal characteristic detecting unit 912. The signal characteristic detecting unit 912 includes a plurality of EOR circuits 1200 in addition to the configuration elements shown in FIG. 10. The plurality of EOR circuits 1200 take a set of two sampling results of each of pairs of the sequential timing comparators 1014 and perform exclusive OR operation on the sets of sampling results respectively.

Particularly, the EOR circuit 1200 of the first stage performs exclusive OR operation on the sampling result (Q0) of the timing comparator 1014 of the first stage and the sampling result (Q1) of the timing comparator 1014 of the second stage and outputs the operation result (EDG1). And the EOR circuit 1200 of the second stage performs exclusive OR operation on the sampling result (Q1) of the timing comparator 1014 of the second stage and the sampling result (Q2) of the timing comparator 1014 of the third stage and outputs the operation result (EDG2). And the EOR circuit 1200 of the third stage performs exclusive OR operation on the sampling result (Q2) of the timing comparator 1014 of the third stage and the sampling result (Q3) of the timing comparator 1014 of the fourth stage and outputs the operation result (EDG3). And the EOR circuit 1200 of the n-th stage performs exclusive OR operation on the sampling result (Qn−1) of the timing comparator 1014 of the n-th stage and the sampling result (Qn) of the timing comparator 1014 of the n+1-th stage and outputs the operation result (EDGn). Further, the plurality of EOR circuits 1200 may be other circuits except the EOR circuits if they are to output a logic value that indicates whether the pair of sampling results are different from each other or not.

Figure 13:
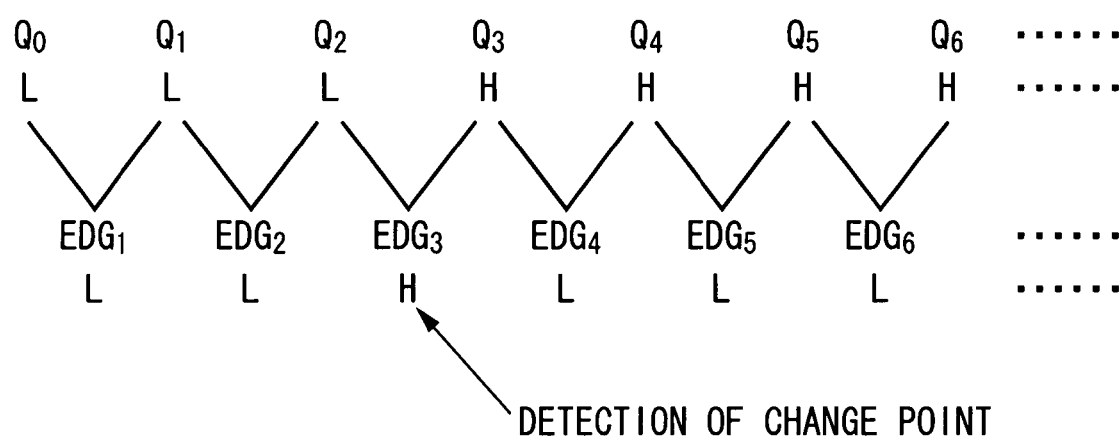
FIG. 13 shows an example of the edge detection operation by the signal characteristic detecting unit.

FIG. 13 shows an example of the edge detection operation by the signal characteristic detecting unit 912. The signal characteristic detecting unit 912 detects the timing of the strobe signal in response to one of the EOR circuits 1200, which outputs the logic value indicating that a pair of sampling results are different from each other among the plurality of EOR circuits 1200, as the edge of the data signal. In other words, it detects the timing of the strobe signal, when the timing comparators 1014 sample the pair of sampling results used by the EOR circuit 1200, which outputs the logic value indicating that the pair of sampling results are different from each other, to perform exclusive OR operation, as the edge of the data signal outputted from the device under test 916.

For example, as shown in FIG. 13, if the sampling results (Q0, Q1 and Q2) of the timing comparators 1014 of the first to third stages are "L" and the sampling results (Q3, Q4, Q5, Q6 ... ) of the timing comparators 1014 of the fourth stage and later are "H", it is shown that the operation result (EDG3) of the EOR circuit 1200 of the third stage, which performs exclusive OR operation on the sampling result (Q2) of the timing comparator 1014 of the third stage and the sampling result (Q3) of the timing comparator 1014 of the fourth stage, is "H", i.e. the pair of sampling results are different from each other. Accordingly, the signal characteristic detecting unit 912 of this embodiment detects the timing of the strobe signal (C3) taken by the timing comparator 1014 of the fourth stage as the edge of the data signal. According to the testing apparatus 700 related to this embodiment, since the edge of the data signal outputted from the device under test 916 can be detected by a hardware circuit, it is possible to perform the test of the device under test 916 in extremely short time.

Figure 14:
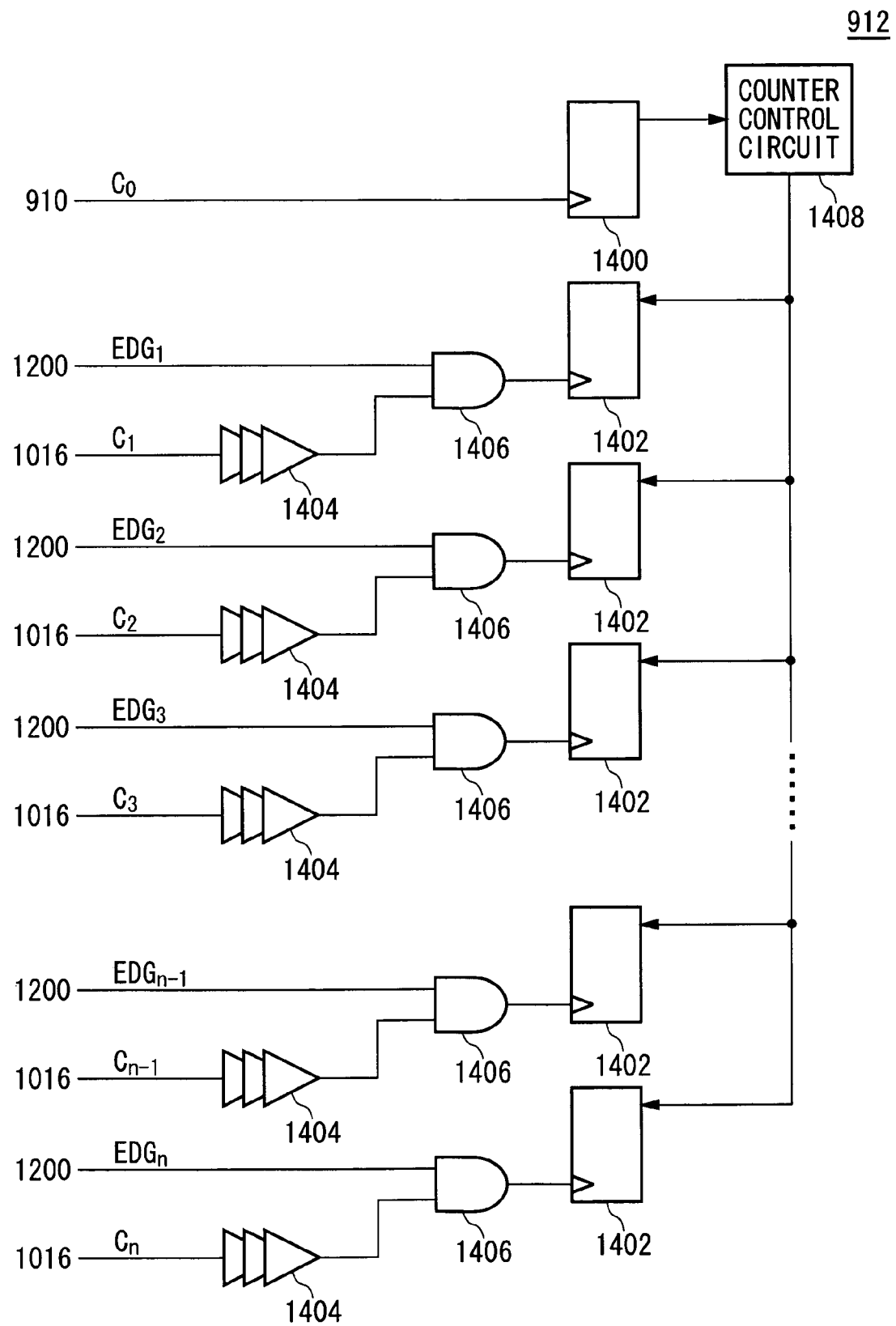
FIG. 14 shows an example of the configuration of the signal characteristic detecting unit.

FIG. 14 shows an example of the configuration of the signal characteristic detecting unit 912. The signal characteristic detecting unit 912 includes a counter 1400, a plurality of counters 1402, a plurality of buffers 1404, a plurality of AND circuits 1406, and a counter control circuit 1408 in addition to the configuration elements of FIGS. 10 and 12.

The counter 1400 counts the strobe signal (C0) generated by the timing generator 910 and supplies the count value to the counter control circuit 1408. And each of the plurality of counters 1402 counts the number of times each of the plurality of EOR circuits 1200 outputs the logic value that indicates the pair of sampling results are different from each other, if each of the plurality of timing comparators 1014 performs sampling operation a plurality of times on each of the plurality of data signals at the timing of each of the plurality of strobe signals so that each of the plurality of EOR circuits 1200 performs exclusive OR operation a plurality of times. And the signal characteristic detecting unit 912 measures the jitter of the data signal outputted by the device under test 916 based on the count value of the plurality of the counter 1402.

Particularly, each of the plurality of buffers 1404 delays each of the plurality of strobe signals (C1, C2, C3, ... Cn−1, Cn) outputted from each of the plural stages of variable delay elements 1016 and supplies it to the plurality of AND circuits 1406. Each of the plurality of buffers 1404 preferably delays each of the plurality of strobe signals (C1, C2, C3, . . . Cn−1, Cn) more than the hold time of each of the plurality of counters 1402. Accordingly, the plurality of timing comparators 101 and the plurality of counters 1402 can operate as a delay line. Each of the plurality of AND circuits 1406 performs exclusive OR operation on the plurality of operation results (EDG1, EDG2, EDG3, . . . EDGn−1, EDGn) respectively outputted by the plurality of EOR circuits 1200 and the plurality of strobe signals (C1, C2, . . . Cn−1, Cn) respectively delayed by the plurality of buffers 1404 and supplies the operation result to the plurality of counters 1402.

Each of the plurality of counters 1402 increases the count value in order that the count value corresponds to each of the plurality of strobe signals, which indicates the timing of the edge of the data signal outputted from the device under test 916, based on the operation result outputted from each of the plurality of AND circuits 1406. The counter control circuit 1408 supplies a counter control signal to force the plurality of counters 1402 to count to the plurality of counters 1402, and if the counter 1400 has counted the strobe signal (C0) such that the count value amounts to a predetermined parameter, it supplies a counter control signal to force the plurality of counters 1402 to stop counting to the plurality of counters 1402.

Figure 15:
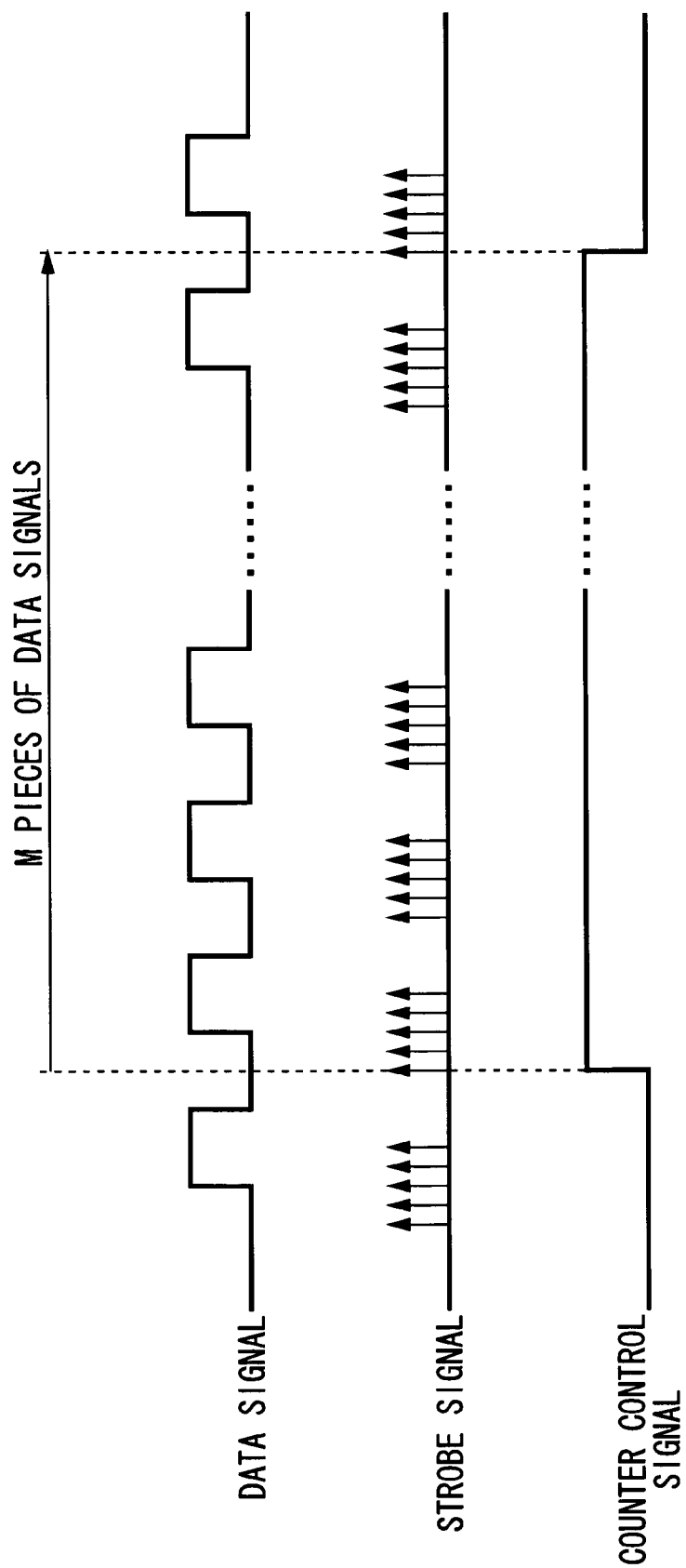
FIG. 15 shows an example of the jitter measurement operation by the signal characteristic detecting unit.
Figure 16:
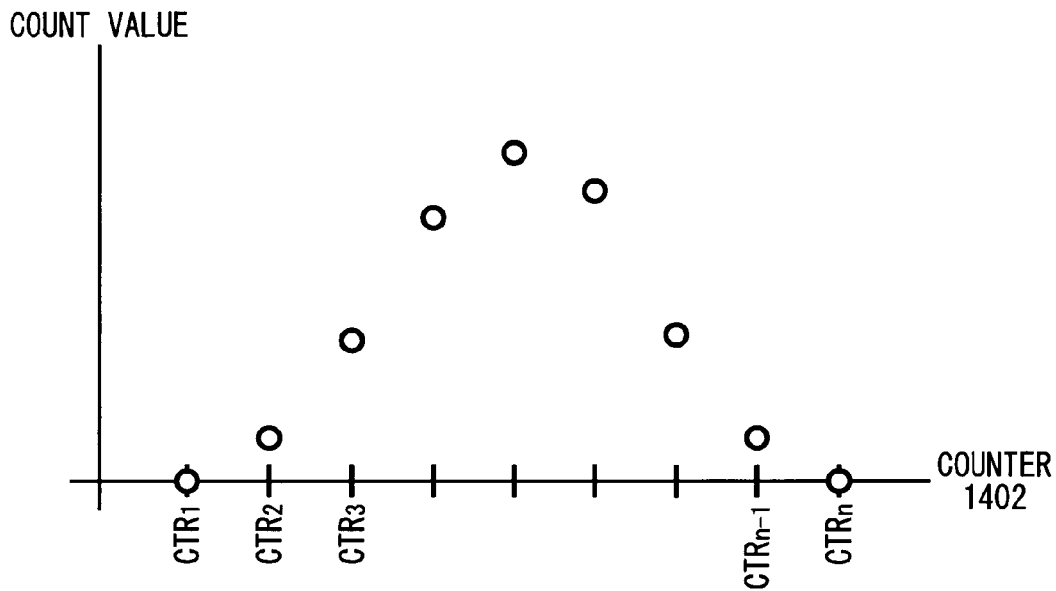
FIG. 16 shows an example of the jitter measurement operation by the signal characteristic detecting unit.
Figure 16:
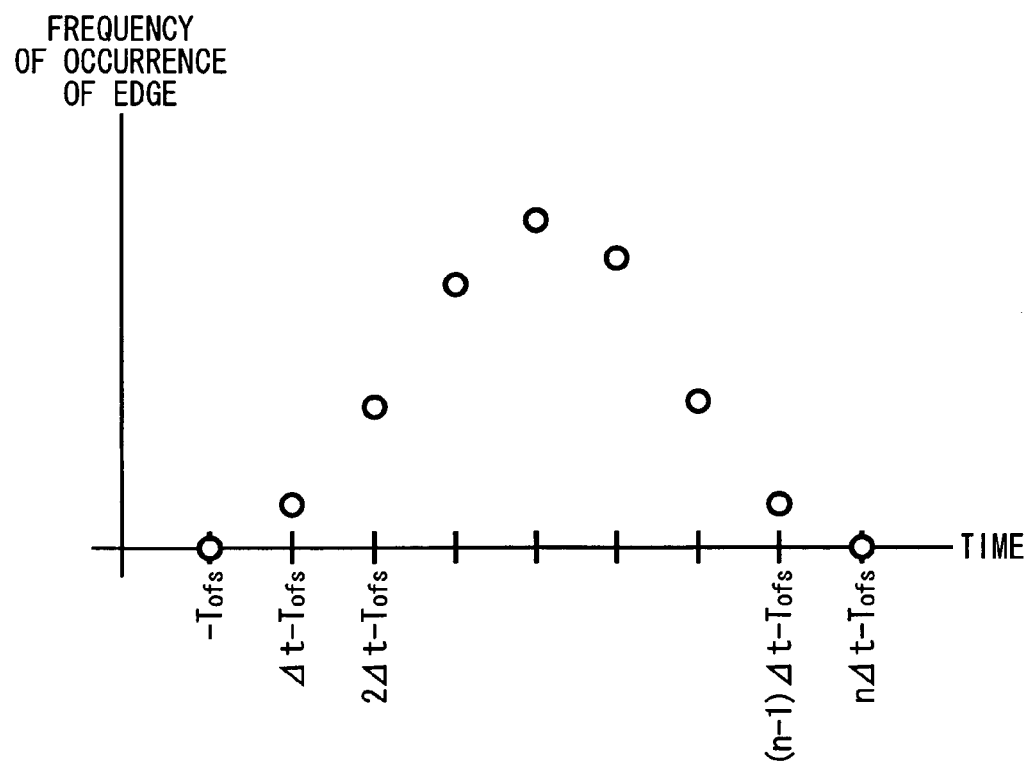

FIGS. 15 and 16 show an example of the jitter measurement operation by the signal characteristic detecting unit 912. FIG. 16(*a*) shows the relation between each of the plurality of counters 1402 and the count value of the plurality of counters 1402. FIG. 16(*b*) shows the relation between the timing of the plurality of strobe signals and the frequency of the occurrence of the edge of the data signal.

As shown in FIG. 15, the plurality of timing comparators 1014 sample each of the plurality of data signals outputted from the device under test 916 by the plurality of strobe signals, while the plurality of EOR circuits 1200 perform exclusive OR operation on the sampling results of the timing comparators 1014 and detect and output the edge of the data signal outputted from the device under test 916. And the plurality of counters 1402 count the operation results of the plurality of EOR circuits 1200 in response to the plurality of data signals, e.g. M pieces of data signals based on the counter control signal outputted by the counter control circuit 1408.

And by retrieving and plotting the count value of each of the plurality of counters 1402, the graph as shown in FIG. 16(*a*) can be obtained. The plurality of counters 1402 correspond to the plurality of strobe signals respectively. Accordingly, in the graph shown in FIG. 16, by replacing each of the plurality of counters 1402 with the timing of the plurality of strobe signals and replacing the count value of each of the plurality of counters 1402 with the frequency of the occurrence of the edge, a histogram graph of the phase of the data signal in response to the strobe signal can be obtained as shown in FIG. 16(*b*). Accordingly, the jitter of the data signal outputted from the device under test 916 can be measured.

As above, by using the plurality of counters 1402, the edge of the data signal generated at the timing of each of the plurality of strobe signals whose phases are different can be counted at the timing of each of the plurality of strobe signals. According to the testing apparatus 700 related to this embodiment, since the jitter of the data signal outputted from the device under test 916 can be measured by a hardware circuit, it is possible to perform the test of the device under test 916 in extremely short time.

Figure 17:
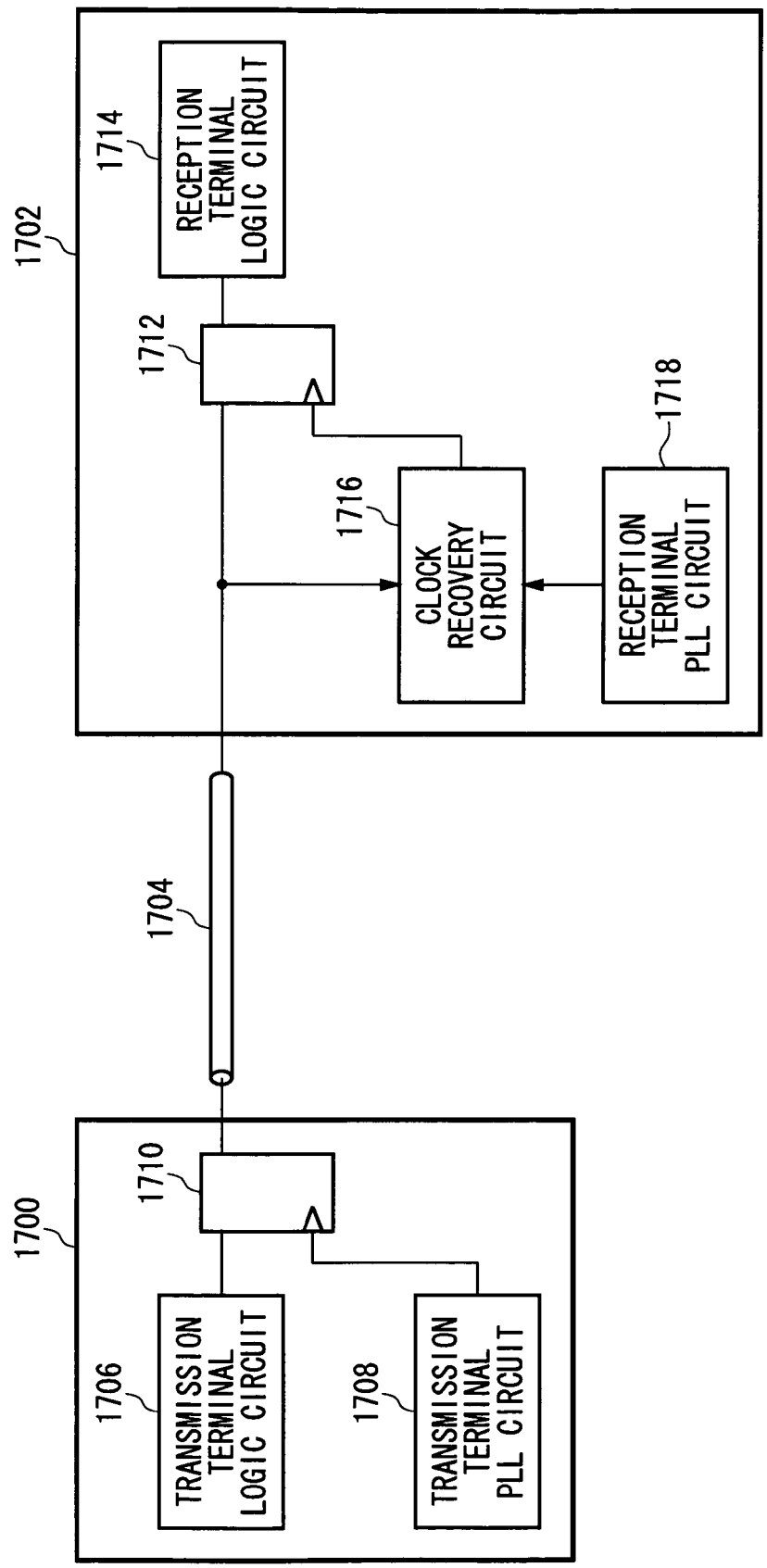
FIG. 17 shows an example of the configuration of communication devices.

FIG. 17 shows an example of the configuration of communication devices 1700 and 1702 according to a third exemplary embodiment of this invention. The communication device 1700 is an LSI of a transmission terminal (TX) for performing high speed data transmission. And the communication device 1702 is an LSI of a reception terminal (RX) for performing high speed data transmission. The communication device 1700 transmits data to the communication device 1702 via the transmission line 1704, whereas the communication device 1702 receives the data from the communication device 1700 via the transmission line 1704.

The communication device 1700 includes a transmission terminal logic circuit 1706, a transmission terminal PLL circuit 1708, and a flip-flop circuit 1710. The transmission terminal logic circuit 1706 generates a data signal and supplies it to the flip-flop circuit 1710. And the transmission terminal PLL circuit 1708 generates a clock signal and supplies it to the flip-flop circuit 1710. And the flip-flop circuit 1710 synchronously transmits the data signal generated by the transmission terminal logic circuit 1706 to the communication device 1702 with the clock signal generated by the transmission terminal PLL circuit 1708.

The communication device 1702 includes a flip-flop circuit 1712, a reception terminal logic circuit 1714, a clock recovery circuit 1716, and a reception terminal PLL circuit 1718. The reception terminal PLL circuit 1718 is an example of the reference clock generating circuit of this invention. The reception terminal PLL circuit 1718 generates a clock signal and supplies it to the clock recovery circuit 1716. The clock recovery circuit 1716 receives the data signal transmitted from the communication device 1700, adjusts the timing of the clock signal generated by the reception terminal PLL circuit 1718 in response to the data signal and supplies it to the flip-flop circuit 1712. And the flip-flop circuit 1712 synchronizes the data signal transmitted from the communication device 1700 with the clock signal generated by the clock recovery circuit 1716 and supplies it to the reception terminal logic circuit 1714. And the reception terminal logic circuit 1714 synchronously deals with the data signal transmitted from the communication device 1700 with the clock signal generated by the clock recovery circuit 1716.

Figure 18:
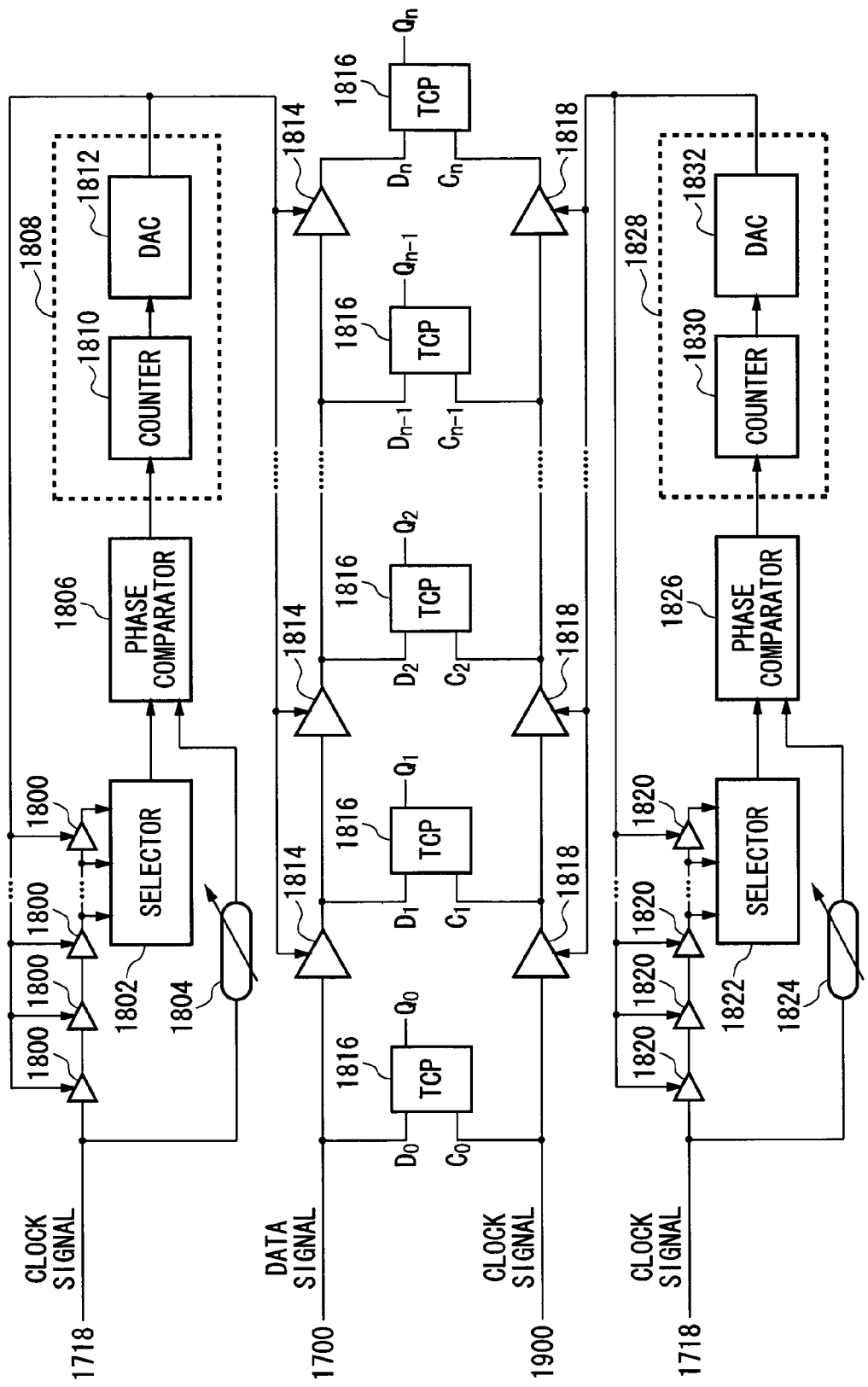
FIG. 18 shows an example of the configuration of a clock recovery circuit.
Figure 19:
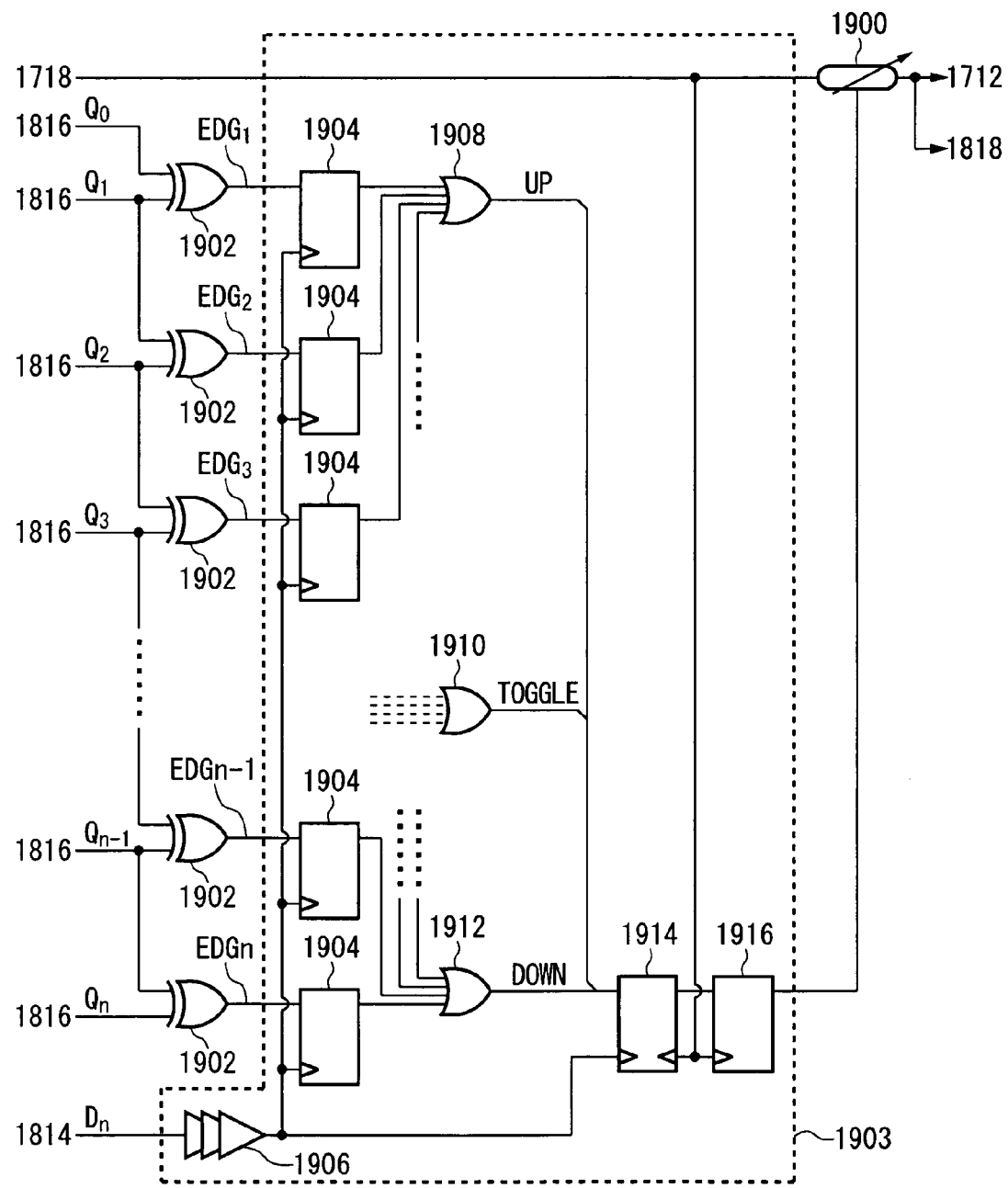
FIG. 19 shows an example of the configuration of the clock recovery circuit.

FIGS. 18 and 19 show an example of the configuration of the clock recovery circuit 1716. As shown in FIG. 18, the clock recovery circuit 1716 includes plural stages of variable delay elements 1800, a selector 1802, a variable delay element 1804, a phase comparator 1806, a delay amount control unit 1808, plural stages of variable delay elements 1814, a plurality of timing comparators 1816, plural stages of variable delay elements 1818, plural stages of variable delay elements 1820, a selector 1822, a variable delay element 1824, a phase comparator 1826, and a delay amount control unit 1828. The delay amount control unit 1808 includes a counter 1810 and a DAC 1812, and the delay amount control unit 1828 includes a counter 1830 and a DAC 1832.

The plural stages of variable delay elements 1814 which are coupled in series sequentially delay a data signal transmitted from the communication device 1700 by a delay amount T. And the plural stages of variable delay elements 1818 which are coupled in series sequentially delay a clock signal generated by a reception terminal PLL circuit 1718 and delayed by a recovery variable delay circuit 1900 as much as a delay amount T+Δt which is larger than the delay amount T. And the plurality of timing comparators 1816 sample each of the plurality of data signals delayed by each of the plural stages of variable delay elements 1814 by the clock signal delayed by the variable delay element 1818 whose stage is the same as each of the plural stages of variable delay elements 1814.

Further, each of the plurality of timing comparators 1816, which has the same configuration and function of the timing comparator 100, samples each of the plurality of data signals (D0, D1, D2, . . . Dn−1, Dn) whose delay amounts are different by each of the plurality of clock signals (C0, C1, C2, . . . Cn−1, Cn) whose delay amounts are different and outputs the sampling results (Q0, Q1, Q2, . . . Qn−1, Qn).

And the plural stages of variable delay elements 1800 which are coupled in series sequentially delay the clock signal generated by the reception terminal PLL circuit 1718 and supply it to the selector 1802. Further, the plural stages of variable delay elements 1800 have approximately the same delay characteristics as the plural stages of variable delay elements 1814. And the selector 1802 selects one of the clock signals outputted by the plural stages of variable delay elements 1800 and supplies it to the phase comparator 1806. And the variable delay element 1804 which is coupled in parallel to the plural stages of variable delay elements 1800 delays the clock signal generated by the reception terminal PLL circuit 1718 as much as a predetermined delay amount and supplies it to the phase comparator 1806.

The phase comparator 1806 compares the phase of the clock signal delayed by the plural stages of variable delay elements 1800, supplied from the selector 1802, with the phase of the clock signal delayed by the variable delay element 1804. And the delay amount control unit 1808 controls the delay amounts of the plural stages of variable delay elements 1800 and the delay amounts of the plural stages of variable delay elements 1814 based on the comparison result of the phase comparator 1806 in order that the phase of the clock signal delayed by the plural stages of variable delay elements 1800, supplied from the selector 1802, and the phase of the data signal delayed by the plural stages of variable delay elements 1814 are approximately equal to the phase of the clock signal delayed by the variable delay element 1804 after predetermined cycles.

And the plural stages of variable delay elements 1820 which are coupled in series sequentially delay the clock signal generated by the reception terminal PLL circuit 1718 and supply it to the selector 1822. Further, the plural stages of variable delay elements 1820 have approximately the same delay characteristics as the plural stages of variable delay elements 1818. And the selector 1822 selects one of the clock signals outputted by the plural stages of variable delay elements 1820 and supplies it to the phase comparator 1826. And the variable delay element 1824 which is coupled in parallel to the plural stages of variable delay elements 1820 delays the clock signal generated by the reception terminal PLL circuit 1718 as much as a predetermined delay amount and supplies it to the phase comparator 1826.

The phase comparator 1826 compares the phase of the clock signal delayed by the plural stages of variable delay elements 1818 supplied from the selector 1822 with the phase of the clock signal delayed by the variable delay element 1824. And the delay amount control unit 1828 controls the delay amounts of the plural stages of variable delay elements 1818 and the delay amounts of the plural stages of variable delay elements 1820 based on the comparison result of the phase comparator 1826 in order that the phase of the clock signal delayed by the plural stages of variable delay elements 1818, supplied from the selector 1822, and the phase of the data signal delayed by the plural stages of variable delay elements 1820 are approximately equal to the phase of the clock signal delayed by the variable delay element 1824 after predetermined cycles.

Further, each of the variable delay elements 1800, the selector 1802, the variable delay element 1804, the phase comparator 1806, the delay amount control unit 1808, the counter 1810, the DAC 1812, and the variable delay elements 1814 has the same configuration and function as the variable delay elements 402, the selector 403, the variable delay element 404, the phase comparator 406, the delay amount control unit 408, the counter 410, the DAC 412, and the variable delay elements 502 shown in FIG. 5.

And as shown in FIG. 19, the clock recovery circuit 1716 includes a recovery variable delay circuit 1900, a plurality of EOR circuits 1902, and a timing judging unit 1903. The plurality of EOR circuits 1902 take a set of two sampling results of each of pairs of the sequential timing comparators 1816 and perform exclusive OR operation on the sets of sampling results respectively. And the timing judging unit 1903 judges the timing of the clock signal generated by the reception terminal PLL circuit 1718 and delayed by the recovery variable delay circuit 1900 in response to the data signal based on the operation result of each of the plurality of EOR circuits 1902. Particularly, the timing judging unit 1903 judges the timing of the clock signal generated by the reception terminal PLL circuit 1718 delayed by the recovery variable delay circuit 1900 in response to the data signal by detecting the timing of the clock signal, when the timing comparators 1816 sample the pair of sampling results used by the EOR circuit 1902, which outputs the logic value indicating that the pair of sampling results are different from each other, to perform exclusive OR operation, as the edge of the data signal. And the recovery variable delay circuit 1900 delays the clock signal generated by the reception terminal PLL circuit 1718 and supplies it to the flip-flop circuit 1712 based on the judgment result of the timing judging unit 1903. In addition, the plurality of EOR circuits 1902 have the same configuration and function as the plurality of EOR circuits 1200 shown in FIG. 12.

And the timing judging unit 1903 includes a plurality of flip-flop circuits 1904, a buffer 1906, a first OR circuit 1908, a third OR circuit 1910, a FIFO circuit 1914, a second OR circuit 1912, and a counter 1916. The buffer 1906 delays the clock signal outputted by the variable delay element 1814 of the last stage and supplies it to each of the plurality of flip-flop circuits 1904. And the flip-flop circuit 1904 supplies the operation results of the plurality of EOR circuits 1902 to the first OR circuit 1908, the third OR circuit 1910, or the second OR circuit 1912.

Here, the plurality of timing comparators 1816 include a first timing comparator group which is a set of the plurality of timing comparators 1816 for sampling the data signal based on the clock signal where the time delayed by the variable delay elements 1818 is a first delay time or less, a second timing comparator group which is a set of the plurality of timing comparators 1816 for sampling the data signal based on the clock signal where the time delayed by the variable delay elements 1818 is a second delay time or more, and a third timing comparator group which is a set of the plurality of timing comparators 1816 for sampling the data signal based on the clock signal where the time delayed by the variable delay elements 1818 is larger than the first delay time and smaller than the second delay time.

And the plurality of EOR circuits 1902 include a first EOR circuit group which is a set of the plurality of EOR circuits 1902 used for exclusive OR operation on the sampling results of the plurality of timing comparators 1816 included in the first timing comparator group, a second EOR circuit group which is a set of the plurality of EOR circuits 1902 used for exclusive OR operation on the sampling results of the plurality of timing comparators 1816 included in the second timing comparator group, and a third EOR circuit group which is a set of the plurality of EOR circuits 1902 used for exclusive OR operation on the sampling results of the plurality of timing comparators 1816 included in the third timing comparator group.

And the first OR circuit 1908 performs OR operation on the operation results of the plurality of EOR circuits 1902 included in the first EOR circuit group and supplies the result to the FIFO circuit 1914. And the third OR circuit 1910 performs OR operation on the operation results of the plurality of EOR circuits 1902 included in the second EOR circuit group and supplies the result to the FIFO circuit 1914. And the second OR circuit 1912 performs OR operation on the operation results of the plurality of EOR circuits 1902 included in the third EOR circuit group and supplies the result to the FIFO circuit 1914. In other words, if the edge of the data signal in response to the clock signal is earlier than the first timing, the first OR circuit 1908 outputs a logic value "1", the third OR circuit 1910 outputs a logic value "0", and the second OR circuit 1912 outputs a logic value "0". And if the edge of the data signal in response to the clock signal is later than the first timing and earlier than the second timing, the first OR circuit 1908 outputs the logic value "0", the third OR circuit 1910 outputs the logic value "1", and the second OR circuit 1912 outputs the logic value "0". And if the edge of the data signal in response to the clock signal is later than the second timing, the first OR circuit 1908 outputs the logic value "0", the third OR circuit 1910 outputs the logic value "0", and the second OR circuit 1912 outputs the logic value "1".

The FIFO circuit 1914 synchronously enters the logic values outputted the first, third and second OR circuits 1908, 1910 and 1912 with the clock signal delayed by the buffer 1906, whereas synchronously retrieving them with the clock signal generated by the reception terminal PLL circuit 1718 and supplying them to the counter 1916. The counter 1916 synchronously counts the number of times each of the first, third and second OR circuits 1908, 1910 and 1912 outputs the logic value "1" with the clock signal generated by the reception terminal PLL circuit 1718, if each of the plurality of timing comparators 1816 performs sampling operation a plurality of times on each of the plurality of data signals by each of the plurality of clock signals and each of the plurality of EOR circuits 1902 performs exclusive OR operation so that each of the first, third and second OR circuits 1908, 1910 and 1912 performs OR operation a plurality of times.

The recovery variable delay circuit 1900 changes the delay amount of the clock signal generated by the reception terminal PLL circuit 1718 based on the outputs of the first, third and second OR circuits 1908, 1910 and 1912, i.e. the count value of the counter 1916. Particularly, the recovery variable delay circuit 1900 makes the delay amount of the clock signal larger if the first OR circuit 1908 outputs the logic value "1", does not change the delay amount of the clock signal if the third OR circuit 1910 outputs the logic value "1", and makes the delay amount of the clock signal smaller if the second OR circuit 1912 outputs the logic value "1". Further, without using the counter 1916, the recovery variable delay circuit 1900 may make the delay amount of the clock signal large if the first OR circuit 1908 outputs the logic value "1", not change the delay amount of the clock signal if the third OR circuit 1910 outputs the logic value "1", and make the delay amount of the clock signal small if the second OR circuit 1912 outputs the logic value "1". The recovery variable delay circuit 1900 adjusts the phase of the clock signal in response to the data signal in the above way and performs calibration by BIST (Built In Self Test) or automatic follow-up in order that the phase of the clock signal is near the center of the eye-opening of the data signal.

As above, according to the clock recovery circuit 1716 related to this embodiment, by using the plurality of timing comparators 1816, the phase of the clock signal in response to the data signal can be accurately detected, and further the phase of the clock signal in response to the data signal is followed up, so that the phase of the clock signal can be adjusted in real time. Therefore, according to the communication device 1702 related to this embodiment, even if the phase of the clock signal is changed by the noise or the change of the environmental conditions and further the eye-opening of the data signal becomes small by such cause as the high frequency loss of the transmission line 1704, the phase of the clock signal can be automatically regulated near the center of the eye-opening of the data signal, and thereby extremely stable data transmission can be realized.

Although the present invention has been described by way of exemplary embodiments, it should be understood that those skilled in the art might make many changes and substitutions without departing from the spirit and the scope of the present invention which is defined only by the appended claims.

What is claimed is:

1. A clock recovery circuit for adjusting timing of a clock signal to a data signal, comprising:
   plural stages of first variable delay elements coupled in series for sequentially delaying said data signal by a first delay amount;
   plural stages of second variable delay elements coupled in series for sequentially delaying said clock signal generated by a reference clock generating circuit as much as a second delay amount which is larger than said first delay amount;
   a plurality of timing comparators for sampling each of a plurality of said data signals delayed by each of said plural stages of first variable delay elements with said clock signal delayed by said second variable delay elements whose stages are respectively the same as said plural stages of first variable delay elements;
   a plurality of EOR circuits for performing exclusive OR operation respectively on sets of a plurality of said sampling results, a pair of sampling results by each of pairs of said sequential timing comparators being taken as one of said sets of a plurality of said sampling results;
   a timing judging unit for judging said timing of said clock signal generated by said reference clock generating circuit corresponding to said data signal based on an operation result of each of said plurality of EOR circuits; and
   a recovery variable delay circuit for delaying said clock signal generated by said reference clock generating circuit based on a judgment result of said timing judging unit.

2. A clock recovery circuit as claimed in claim 1, wherein said timing judging unit judges said timing of said clock signal generated by said reference clock generating circuit corresponding to said data signal by detecting timing of said clock signal as an edge of said data signal, when one of said timing comparators receiving said clock signal samples said pair of sampling results, said pair of sampling results being used by one of said plurality of EOR circuits performing exclusive OR operation, said one of said EOR circuits outputting a logic value which indicates that said pair of sampling results are different from each other.

3. A clock recovery circuit as claimed in claim 1, wherein said plurality of timing comparators comprise:
a first timing comparator group, which is a set of said plurality of timing comparators for sampling said data signal based on said clock signal, whose time delayed is a first delay time or less; and
a second timing comparator group, which is a set of said plurality of said timing comparators for sampling said data signal based on said clock signal, whose time delayed is a second delay time or more,
said plurality of EOR circuits comprise:
a first EOR circuit group which is a set of said plurality of EOR circuits using sampling results of said plurality of timing comparators for exclusive OR operation, said plurality of timing comparators being comprised by said first timing comparator group; and
a second EOR circuit group which is a set of said plurality of EOR circuits using sampling results of said plurality of timing comparators for exclusive OR operation, said plurality of timing comparators being comprised by said second timing comparator group,
said timing judging unit comprises:
a first OR circuit for performing OR operation on operation results of said plurality of EOR circuits comprised by said first EOR circuit group; and
a second OR circuit for performing OR operation on operation results of said plurality of EOR circuits comprised by said second EOR circuit group, and
said recovery variable delay circuit changes a delay amount of said clock signal generated by said reference clock generating circuit based on outputs of said first and second OR circuits.

4. A clock recovery circuit as claimed in claim 3, wherein said plurality of timing comparators further comprise:
a third timing comparator group, which is a set of said plurality of timing comparators for sampling said data signal based on said clock signal, whose time delayed is larger than said first delay time and smaller than said second delay time; said plurality of EOR circuits further comprise:
a third EOR circuit group which is a set of said plurality of EOR circuits used for exclusive OR operation on sampling results of said plurality of timing comparators comprised by said third timing comparator group, said timing judging unit further comprises:
a third OR circuit for performing OR operation on operation results of said plurality of EOR circuits comprised by said third EOR circuit group, and
said recovery variable delay circuit does not change a delay amount of said clock signal generated by said reference clock generating circuit, if said third OR circuit outputs a logical sum "1".

5. A clock recovery circuit as claimed in claim 3, wherein said timing judging unit further comprises:
a counter for counting a number of times each of said first and second OR circuits outputs said logic value "1", if each of said plurality of timing comparators performs sampling operation a plurality of times on each of said plurality of data signals at timing of each of said plurality of clock signals, while each of said plurality of EOR circuits performs exclusive OR operation a plurality of times and each of said first and second OR circuits performs OR operation a plurality of times, and said recovery variable delay circuit changes a delay amount of said clock signal generated by said reference clock generating circuit based on a count value of said counter.

6. A clock recovery circuit as claimed in claim 1, further comprising:
plural stages of third variable delay elements coupled in series for sequentially delaying said clock signal generated by said reference clock generating circuit, said plural stages of third variable delay elements having substantially the same delay characteristics as said plural stages of first variable delay elements;
a fourth variable delay element coupled in parallel to said plural stages of third variable delay elements for delaying said clock signal generated by said reference clock generating circuit;
a phase comparator for comparing a phase of said clock signal delayed by said plural stages of third variable delay elements with a phase of said clock signal delayed by said fourth variable delay element; and
a first delay amount control unit for controlling delay amounts of said plural stages of third variable delay elements and said plural stages of first variable delay elements based on a comparison result of said phase comparator in order that said phase of said clock signal delayed by said plural stages of third variable delay elements and said phase of said data signal delayed by said plural stages of first variable delay elements are substantially the same as a phase of said clock signal delayed by said fourth variable delay element after predetermined cycles.

7. A clock recovery circuit as claimed in claim 1, further comprising:
plural stages of fifth variable delay elements coupled in series for sequentially delaying said clock signal generated by said reference clock generating circuit, said plural stages of third variable delay elements having substantially the same delay characteristics as said plural stages of first variable delay elements;
a sixth variable delay element coupled in parallel to said plural stages of fifth variable delay elements for delaying said clock signal generated by said reference clock generating circuit;
a phase comparator for comparing a phase of said clock signal delayed by said plural stages of fifth variable delay elements and a phase of said clock signal delayed by said sixth variable delay element; and
a second delay amount control unit for controlling delay amounts of said plural stages of fifth variable delay elements and said plural stages of second variable delay elements based on a comparison result of said phase comparator in order that said phase of said clock signal delayed by said plural stages of fifth variable delay elements and said phase of said data signal delayed by said plural stages of second variable delay elements are substantially the same as a phase of said clock signal delayed by said sixth variable delay element after predetermined cycles.

8. A clock recovery circuit as claimed in claim 1, wherein each of said plurality of timing comparators comprises:
a dynamic D flip-flop circuit for latching and outputting said data signal received from said first variable delay circuit using parasitic capacitance thereof based on said clock signal received by said corresponding timing comparator;

a buffer for delaying said clock signal received by said corresponding timing comparator as much as a predetermined time; and a D flip-flop circuit for latching and outputting an output signal outputted by said dynamic D flip-flop circuit based on said clock signal delayed by said buffer.

9. A communication device for synchronously processing a data signal with a clock signal, comprising:

a reference clock generating circuit for generating said clock signal;

a clock recovery circuit for adjusting timing of said clock signal to said data signal; and a reception terminal logic circuit for synchronously processing said data signal with said clock signal, wherein said clock recovery circuit comprises:

plural stages of first variable delay elements coupled in series for sequentially delaying said data signal by a first delay amount;

plural stages of second variable delay elements coupled in series for sequentially delaying said clock signal generated by a reference clock generating circuit as much as a second delay amount which is larger than said first delay amount;

a plurality of timing comparators for sampling each of a plurality of said data signals delayed by each of said plural stages of first variable delay elements with said clock signal delayed by said second variable delay elements whose stages are respectively the same as said plural stages of first variable delay elements;

a plurality of EOR circuits for performing exclusive OR operation respectively on sets of a plurality of said sampling results, a pair of sampling results by each of pairs of said sequential timing comparators being taken as one of said sets of a plurality of said sampling results;

a timing judging unit for judging said timing of said clock signal generated by said reference clock generating circuit corresponding to said data signal based on an operation result of each of said plurality of EOR circuits; and a recovery variable delay circuit for delaying said clock signal generated by said reference clock generating circuit based on a judgment result of said timing judging unit.

* * * * *